(12) United States Patent
Lee

(10) Patent No.: US 9,985,048 B2
(45) Date of Patent: May 29, 2018

(54) SEMICONDUCTOR DEVICE AND MANUFACTURING METHOD THEREOF

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days. days.

(21) Appl. No.: 15/280,132

(22) Filed: Sep. 29, 2016

(65) Prior Publication Data

US 2017/0338241 A1 Nov. 23, 2017

(30) Foreign Application Priority Data

May 23, 2016 (KR) .................. 10-2016-0062791

(51) Int. Cl.
```
H01L 29/792      (2006.01)
H01L 27/11582    (2017.01)
H01L 27/1157     (2017.01)
H01L 27/11573    (2017.01)
H01L 29/66       (2006.01)
```
(52) U.S. Cl.
CPC .... *H01L 27/11582* (2013.01); *H01L 27/1157* (2013.01); *H01L 27/11573* (2013.01); *H01L 29/66545* (2013.01); *H01L 29/66833* (2013.01); *H01L 29/792* (2013.01)

(58) Field of Classification Search
CPC ......... H01L 27/11582; H01L 29/66833; H01L 29/66545; H01L 27/1157; H01L 29/792; H01L 27/11573

USPC .......... 257/316, 330, 724; 438/622; 365/148
See application file for complete search history.

(56) References Cited

U.S. PATENT DOCUMENTS

| | | | |
|---|---|---|---|
| 2009/0267135 A1* | 10/2009 | Tanaka .................. | H01L 27/115 257/324 |
| 2013/0100741 A1* | 4/2013 | Choi ................. | H01L 27/11565 365/185.18 |
| 2015/0036429 A1* | 2/2015 | Kim .................. | H01L 27/11551 365/185.05 |

FOREIGN PATENT DOCUMENTS

KR   1020110087870 A   8/2011
KR   1020150081393 A   7/2015

* cited by examiner

*Primary Examiner* — Bo Fan
(74) *Attorney, Agent, or Firm* — William Park & Associates Ltd.

(57) ABSTRACT

A semiconductor device includes a first structure, a dummy buffer stack structure, a peripheral contact hole, and a peripheral contact plug. The first structure may include a substrate and a peripheral circuit disposed on the substrate. The dummy buffer stack structure may be disposed on the first structure. The dummy buffer stack structure may include dummy interlayer insulating layers and dummy sacrificial insulating layers, which are alternately stacked, and first dummy conductive rings stacked in a line inside the respective dummy sacrificial insulating layers. The peripheral contact hole may penetrate the dummy buffer stack structure. The peripheral contact hole may be surrounded by the first dummy conductive rings. The peripheral contact plug may be disposed in the peripheral contact hole. The peripheral contact plug may extend to be connected to the peripheral circuit.

20 Claims, 22 Drawing Sheets

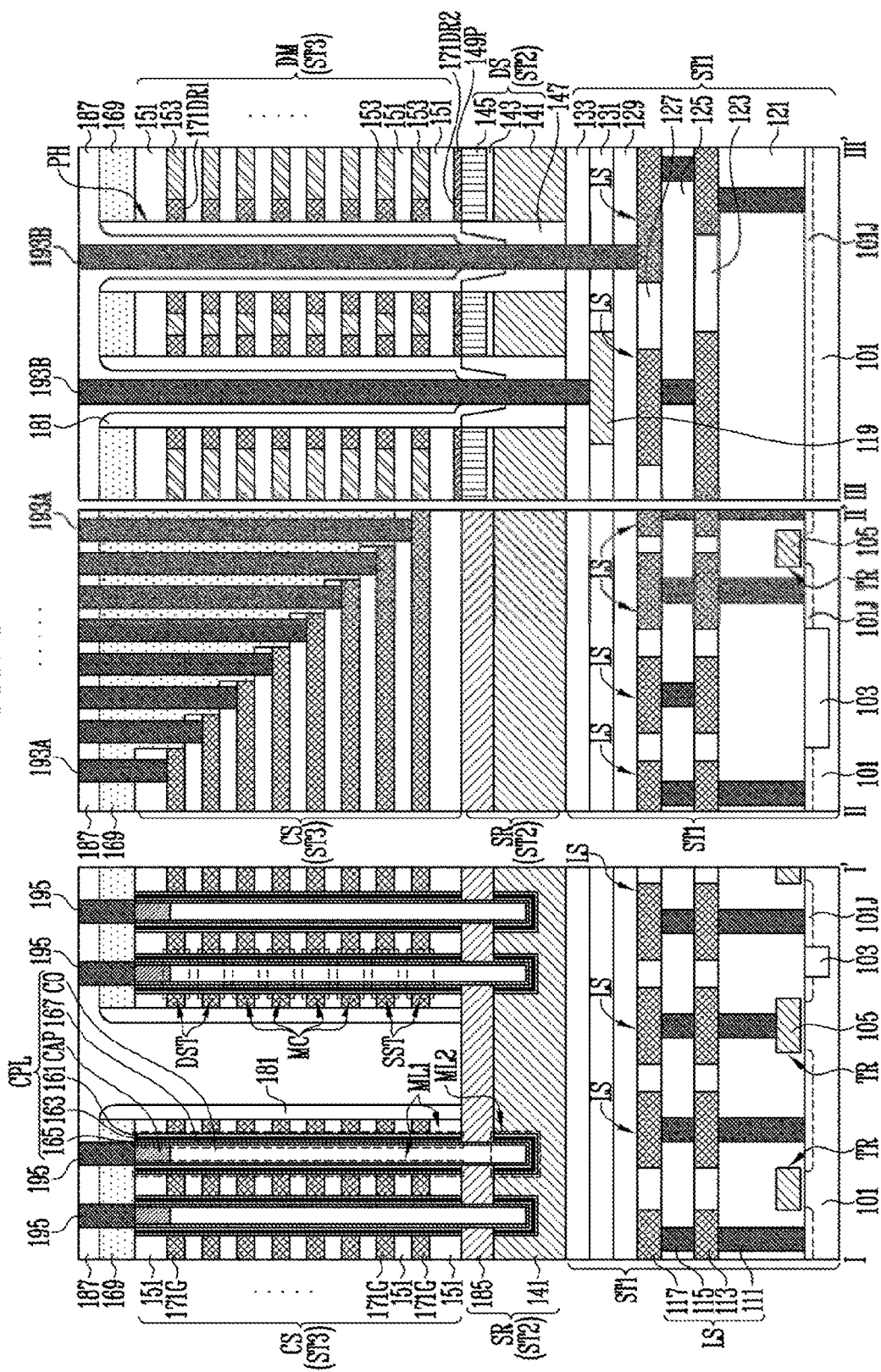

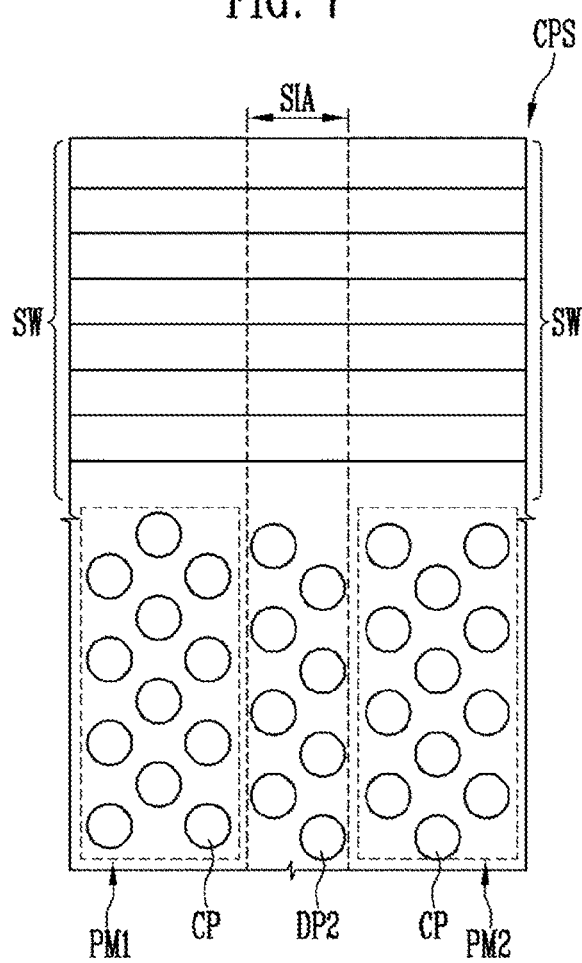

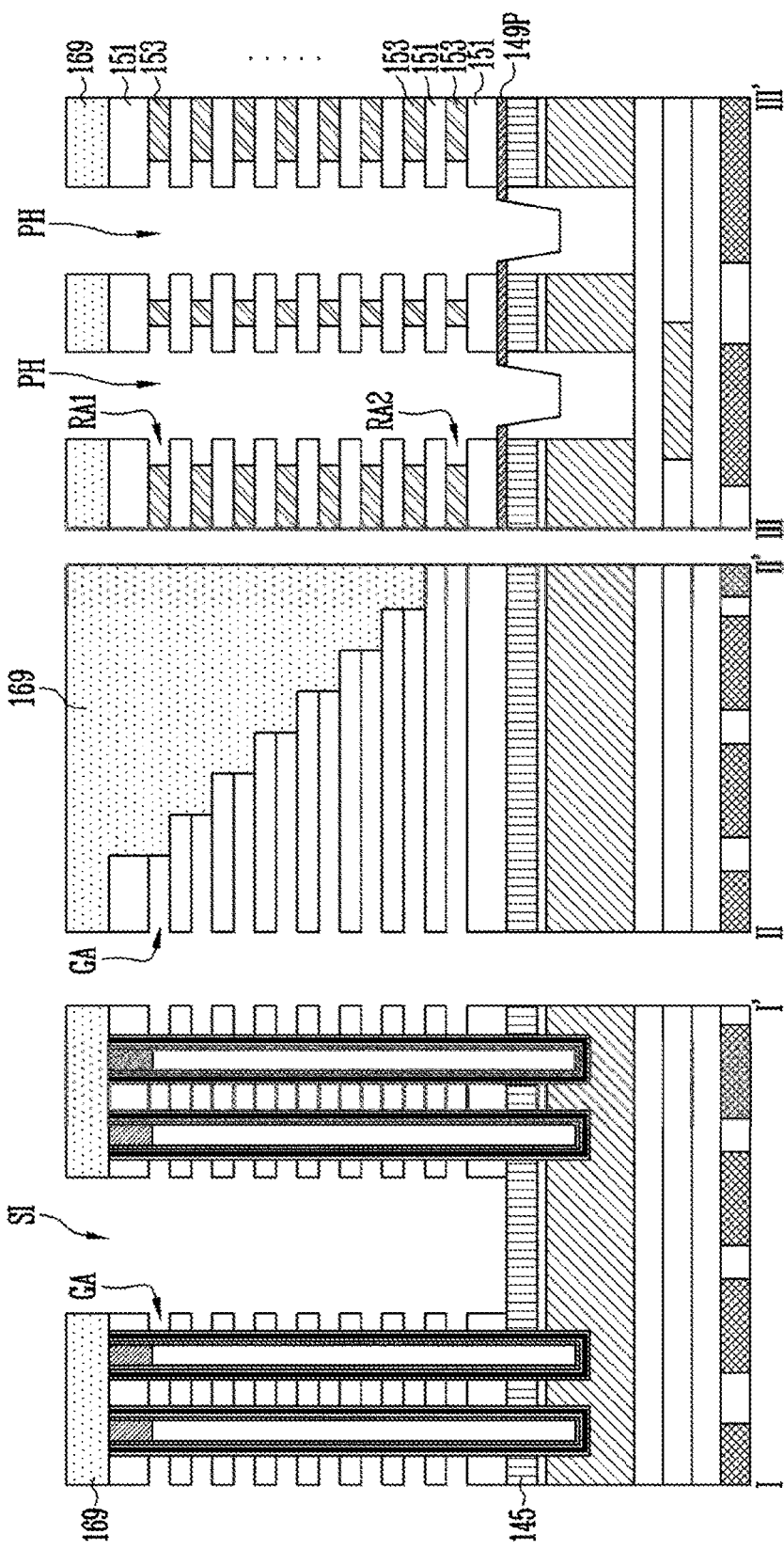

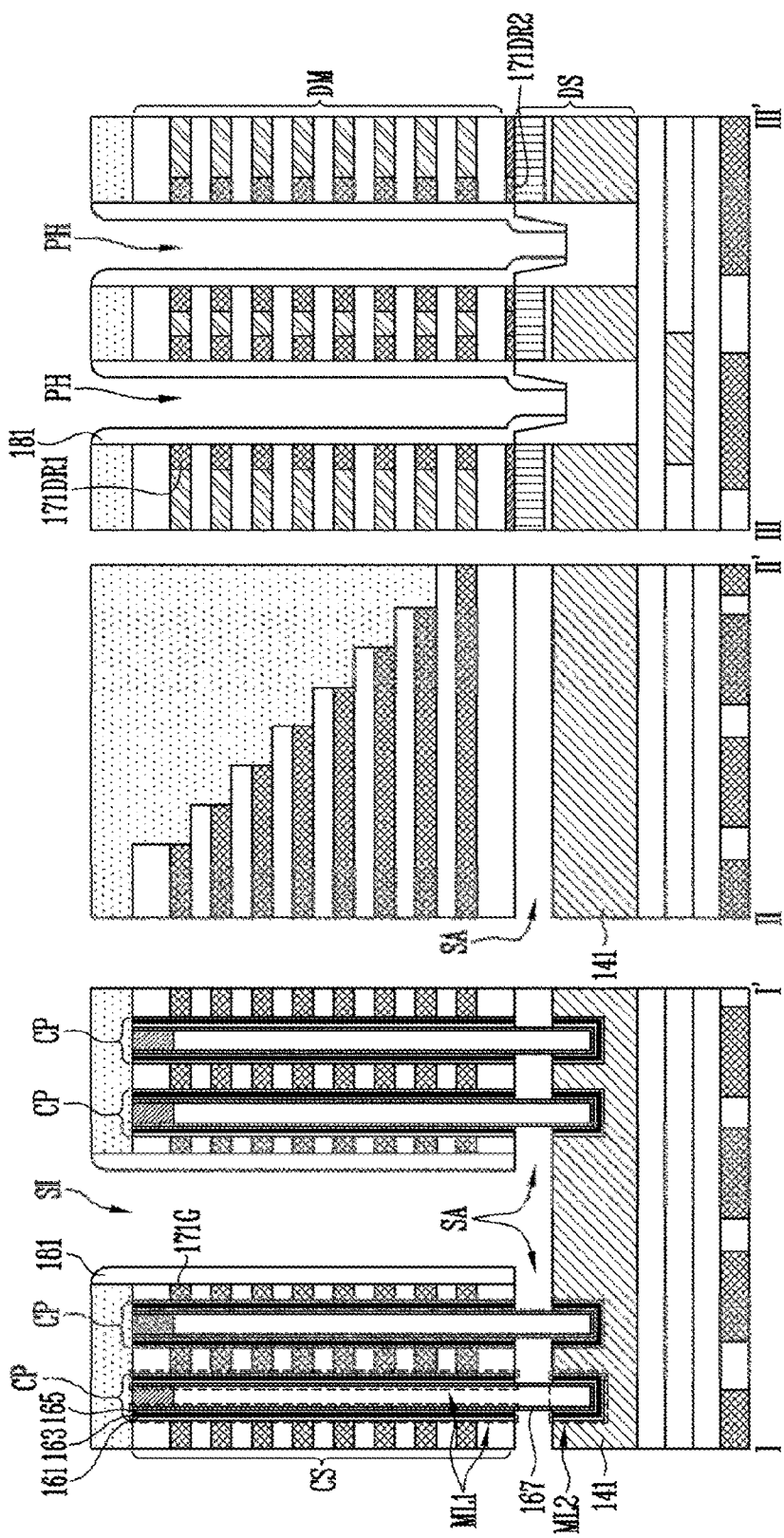

FIG. 11C
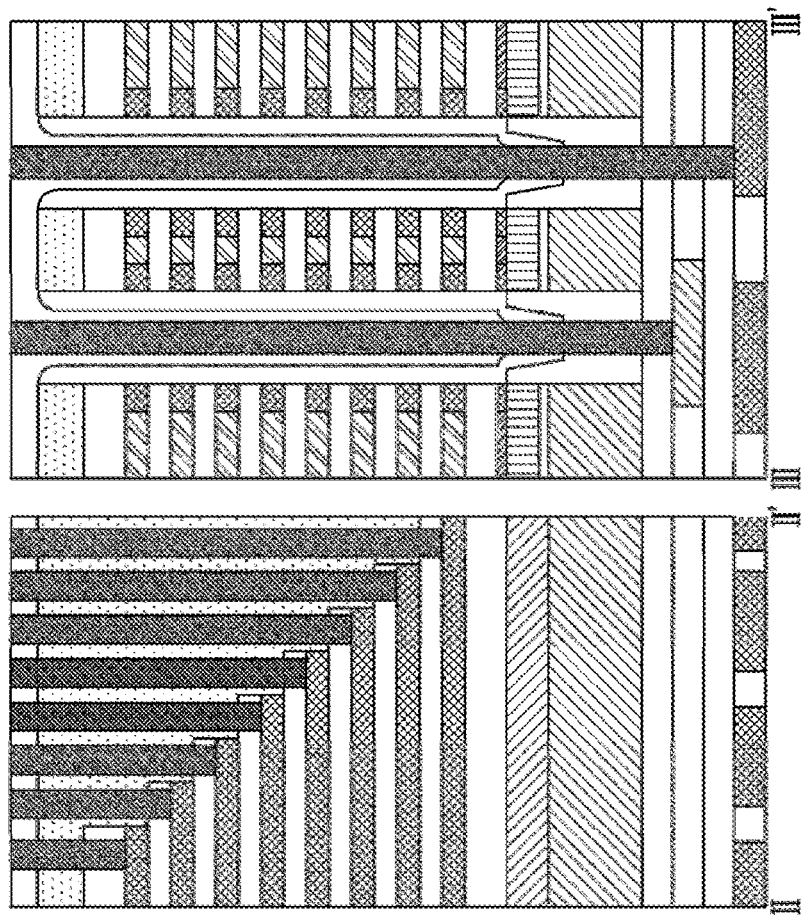
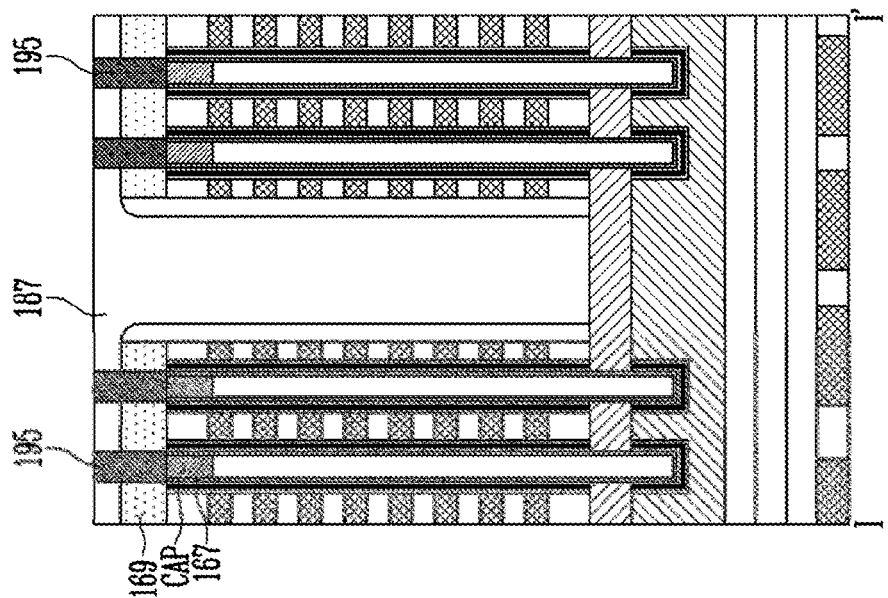

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2016-0062791 filed on May 23, 2016, the entire disclosure of which is incorporated herein by reference.

BACKGROUND

1. Technical Field

An aspect of the present disclosure generally relates to a semiconductor device and a manufacturing method thereof, and more particularly to a semiconductor device including a three-dimensional memory cell array and a manufacturing method thereof.

2. Related Art

A semiconductor device may include a memory cell array including a plurality of memory cells and a peripheral circuit for controlling operations of the memory cells. The memory cell array may include memory cells arranged in various structures. In order to minimize the size of the semiconductor device, there has been proposed a three-dimensional memory cell array including three-dimensionally arranged memory cells.

SUMMARY

According to an aspect of the present disclosure, there is provided a semiconductor device including a first structure, a dummy buffer stack structure, a peripheral contact hole, and a peripheral contact plug. The first structure may include a substrate and a peripheral circuit disposed on the substrate. The dummy buffer stack structure may be disposed on the first structure. The dummy buffer stack structure may include dummy interlayer insulating layers and dummy sacrificial insulating layers, which are alternately stacked, and first dummy conductive rings stacked in a line inside the respective dummy sacrificial insulating layers. The peripheral contact hole may penetrate the dummy buffer stack structure. The peripheral contact hole may be surrounded by the first dummy conductive rings. The peripheral contact plug may be disposed in the peripheral contact hole. The peripheral contact plug may extend to be connected to the peripheral circuit.

According to an aspect of the present disclosure, there is provided a semiconductor device including a first structure, a second structure, a third structure, and a peripheral contact plug. The first structure may include a substrate and a peripheral circuit disposed on the substrate. The second structure may be disposed on the first structure. The second structure may include a source stack structure and a dummy source stack structure, which are disposed at the same height and formed into different stack structures. The third structure may be disposed on the second structure. The third structure may include a cell stack structure and a dummy buffer stack structure, which are isolated from each other. The peripheral contact plug may penetrate the dummy buffer stack structure and the dummy source stack structure. The peripheral contact plug may be electrically connected to the peripheral circuit.

According to an aspect of the present disclosure, there is provided a method of manufacturing a semiconductor device. The method may include forming a first structure including a substrate and a peripheral circuit disposed on the substrate. The substrate may include a first region and a second region. The method may include alternately stacking first material layers and second material layers on the first structure. The method may include forming a first dummy pillar penetrating the first material layers and the second material layers on the second region. The method may include exposing a peripheral contact hole by removing the first dummy pillar. The method may include forming a slit insulating layer filling the peripheral contact hole. The method may include forming a peripheral contact plug penetrating the slit insulating layer and electrically connected to the peripheral circuit.

BRIEF DESCRIPTION OF THE DRAWINGS

FIG. 4 illustrates cross-sectional views of a semiconductor device according to an embodiment of the present disclosure.

FIGS. 5, 6A, 6B, 6C, 6D, 7, 8A, 8B, 8C, 9A, 9B, 9C, 9D, 10A, 10B, 11A, 11B, and 11C are views illustrating a manufacturing method of the semiconductor device according to an embodiment of the present disclosure.

DETAILED DESCRIPTION

Figure 1:
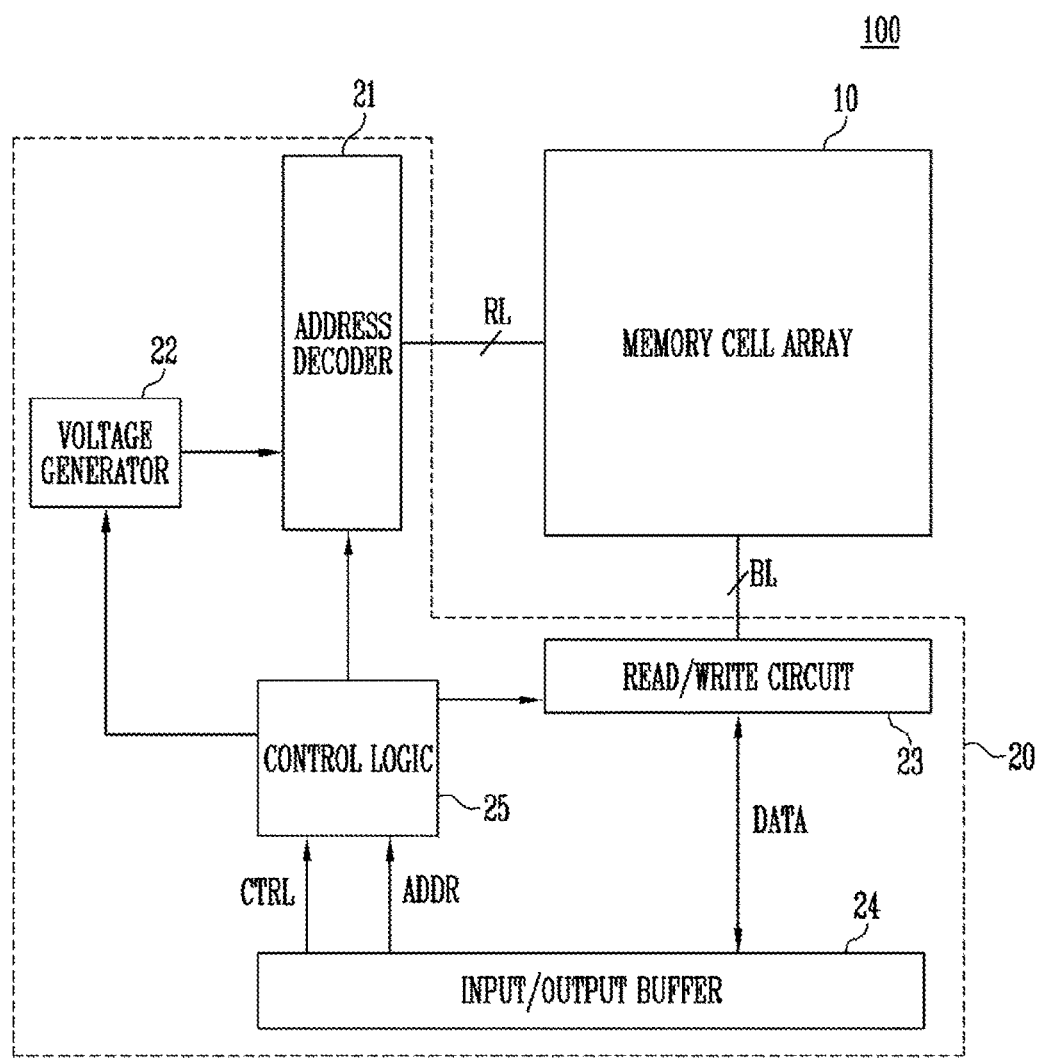
FIG. 1 is a diagram illustrating a semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, example embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art. Further, the scope of the present disclosure should be understood within the scope of the present disclosure defined by the appended claims.

Embodiments provide a semiconductor device and a manufacturing method thereof, which can simplify a manufacturing process.

FIG. 1 is a diagram illustrating a semiconductor device.

Referring to FIG. 1, the semiconductor device 100 includes a memory cell array 10 and a peripheral circuit 20. The semiconductor device 100 may be a nonvolatile memory device. The semiconductor device 100 may be a NAND flash memory device.

The memory cell array 10 may be connected to an address decoder 21 through row lines RL. The memory cell array 10 may be connected to a read/write circuit 23 through bit lines BL.

Memory cells of the semiconductor memory device 100 may be arranged in the memory cell array 10. The memory cells of the memory cell array 10 may be grouped into a plurality of memory blocks. In an embodiment, each of the memory blocks may include a plurality of cell strings. Each of the cell strings may include a plurality of memory cells stacked on a substrate. The memory cells may be nonvolatile memory cells. The memory cells may be connected in series to each other through a channel layer to form a cell string.

The peripheral circuit 20 may include the address decoder 21, a voltage generator 22, the read/write circuit 23, an input/output buffer 24, and a control logic 25.

The address decoder 21 may operate in response to control signals issued by the control logic 25. The address decoder 21 may be connected to the memory cell array 10 through the row lines RL, and may select one or more of the row lines RL in response to address signals. The row lines RL may include drain select lines, word lines, and source select lines of cell structures constituting the memory cell array 10.

The address decoder 21 may receive an address ADDR from the control logic 25. The address ADDR may include a block address and a row address. The address decoder 21 may decode the address ADDR to obtain the block address out of the address ADDR. The address decoder 21 may select a memory block according to the decoded block address.

The voltage generator 22 may operate in response to control signals issued by the control logic 25. The voltage generator 25 may generate an internal power voltage using an external power voltage supplied to the semiconductor device 100. The internal power voltage may be provided to the address decoder 21, the read/write circuit 23, the input/output buffer 24, and the control logic 25 to be used as an operating voltage of the semiconductor device 100.

The read/write circuit 23 may be connected to the memory cell array 10 through the bit lines BL. The read/write circuit 23 may control of potential levels the bit lines BL in response to control signals issued by the control logic 25.

The control logic 25 may be coupled to the address decoder 21, the voltage generator 22, the read/write circuit 23, and the input/output buffer 24. The control logic 25 may receive a control signal CTRL and an address ADDR from the input/output buffer 24. The control logic 25 may control the operations of the semiconductor device 100 in response to the control signal CTRL. The control logic 25 may transmit the address ADDR to the address decoder 21.

The input/output buffer 24 may receive a control signal CTRL and an address ADDR from an external device, and may transmit the control signal CTRL and address ADDR to the control logic 25. Also, the input/output buffer 24 may transmit data DATA input from the external device to the read/write circuit 23, or may output data DATA received from the read/write circuit 23 to the external device.

The peripheral circuit 20 may include a plurality of elements such as driver transistors and resistors necessary for the above-described operations. In order to minimize the size of the semiconductor device, a portion of the peripheral circuit 20 may be disposed to overlap, at least in part, the memory cell array 10, and the memory cell array 10 may include three-dimensionally arranged memory cells.

The memory cell array 10 and the peripheral circuit 20 may be formed on a substrate including first and second regions.

Figure 2A:
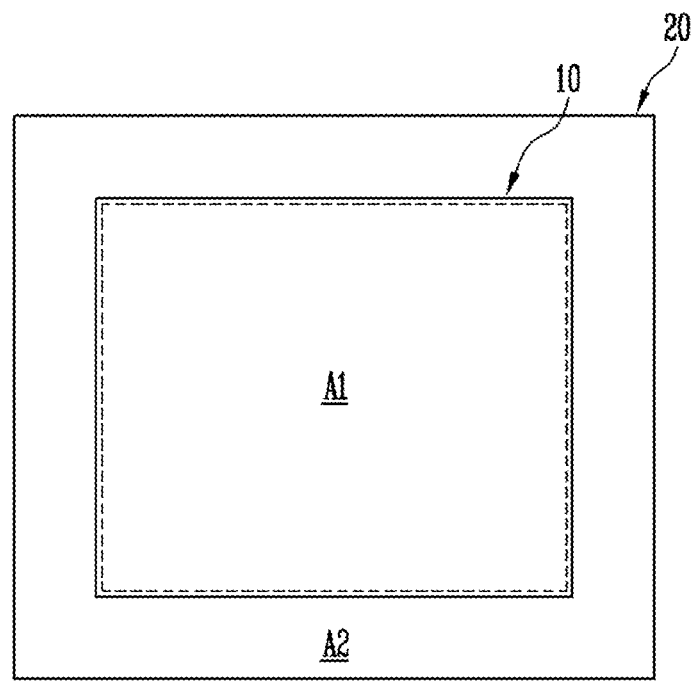
FIGS. 2A and 2B are views illustrating first and second regions of the semiconductor device.
Figure 2B:
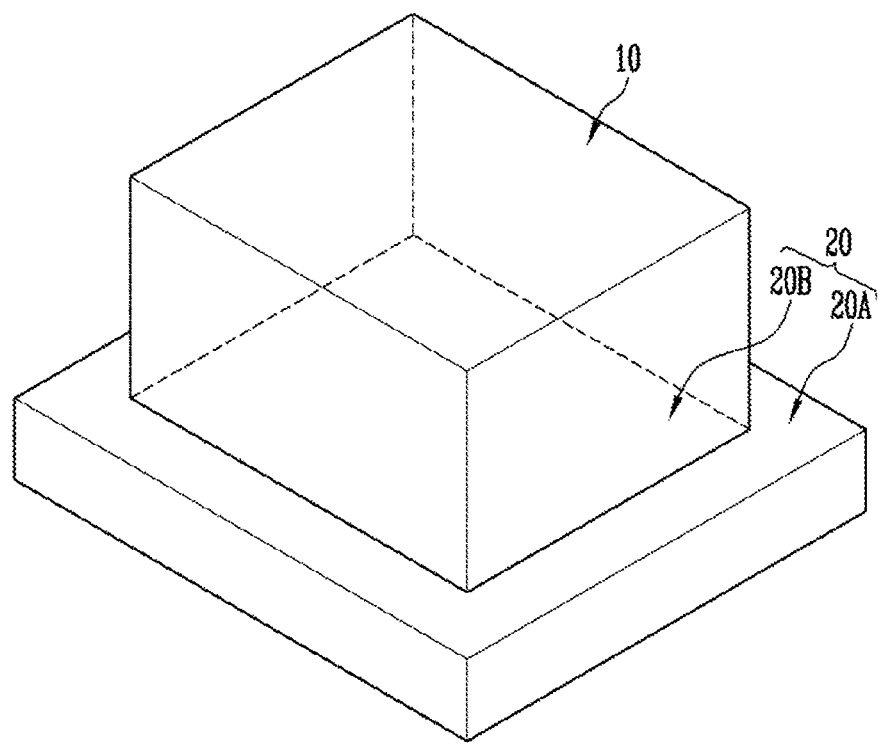

FIGS. 2A and 2B are views illustrating first and second regions of the semiconductor device.

Referring to FIG. 2A, the semiconductor device may include a substrate having a first region A1 and a second region A2. The memory cell array 10 may be disposed on the first region A1 of the substrate. The peripheral circuit 20 may be disposed on the second region A2. The peripheral circuit 20 may be disposed over a part of the substrate where the memory cell array 10 is not formed. Alternatively, a portion of the peripheral circuit 20 may be disposed on the first region A1 to minimize the size of the semiconductor device. In this case, the portion of the peripheral circuit 20 may be disposed under the memory cell array 10, and may overlap at least a portion of the memory cell array 10.

Referring to FIG. 2B, the peripheral circuit 20 may include a first circuit 20A not overlapping the memory cell array 10 and a second circuit 20B overlapping the memory cell array 10.

Each of the first and second circuits 20A and 20B may include driver transistors resistors used for operations of the memory cell array 10. The first circuit 20A may be coupled to the second circuit 20B. Each of the first and second circuits 20A and 20B may be connected to the memory cell array 10 via connecting structures. Alternatively, the first and second circuits 20A and 20B may be connected to each other via connecting structures. The connecting structures may be connected to a peripheral contact plug penetrating a dummy buffer stack structure. The dummy buffer stack structure is a structure isolated from cell stack structures constituting the memory cell array 10.

Figure 3A:
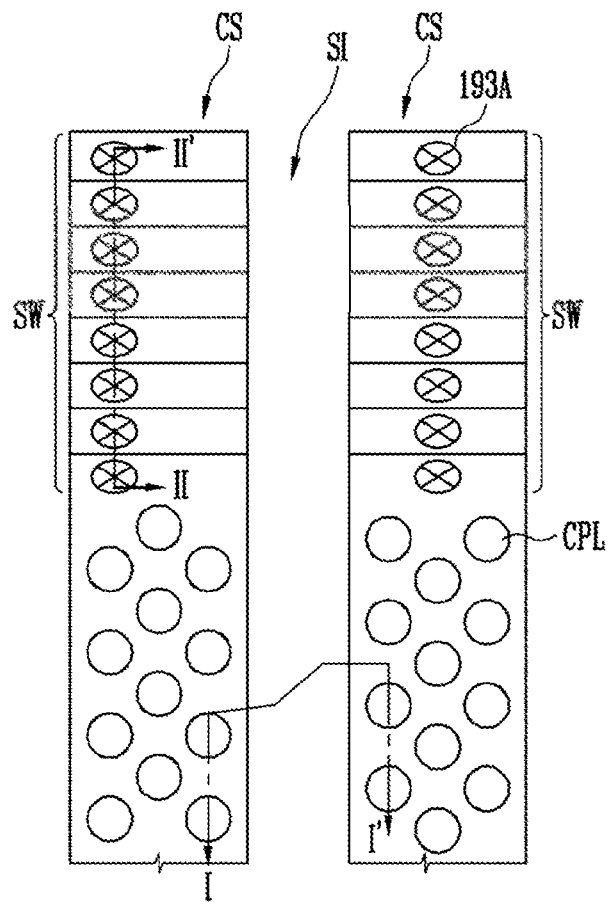
FIGS. 3A and 3B are plan views respectively illustrating cell stack structures and a dummy buffer stack structure according to an embodiment of the present disclosure.
Figure 3B:
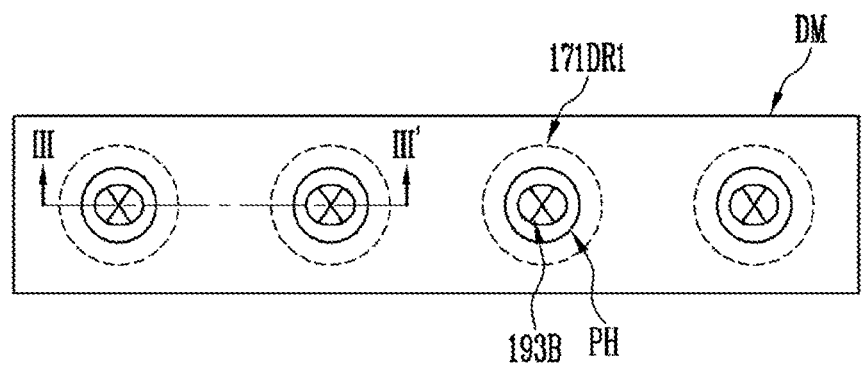

FIGS. 3A and 3B are plan views respectively illustrating cell stack structures and a dummy buffer stack structure according to an embodiment of the present disclosure.

Referring to FIG. 3A, a slit SI may be located between two adjacent cell stack structures CS, and the cell stack structures CS may be electrically isolated from each other by the slit SI. Each of the cell stack structures CS may include interlayer insulating layers and conductive patterns, which are alternately stacked on the first region (e.g., A1 of FIG. 2A) of the substrate, and cell pillars CPL penetrating the interlayer insulating layers and the conductive patterns.

At least one end of each cell stack structure CS may be formed in a step structure SW that exposes at least parts of the conductive patterns. The exposed parts of the conductive patterns may be connected to cell contact plugs 193A, respectively.

FIG. 3A illustrates a partial region of each cell stack structure CS. Although not illustrated, uppermost conductive patterns disposed in uppermost layers of the respective cell stack structures CS may be split into drain select lines by drain isolation slits. In addition, the cell pillars CPL may be connected to bit lines (not illustrated) disposed thereon.

Referring to FIG. 3B, the dummy buffer stack structure DM may be isolated from the cell stack structures (e.g., CS of FIG. 3A). The dummy buffer stack structure DM may include dummy interlayer insulating layers and dummy sacrificial insulating layers, which are alternately stacked on the second region (e.g., A2 of FIG. 2A) of the substrate, and first dummy conductive rings 171DR1 respectively formed inside dummy sacrificial insulating layers to be stacked in a line. Outer walls of the first dummy conductive rings 171DR1 may be surrounded by the dummy sacrificial insulating layers, respectively. In other words, the first dummy conductive rings 171DR1 may be formed in each of the dummy sacrificial insulating layers.

The dummy interlayer insulating layers may be disposed at the same levels as the interlayer insulating layers described in FIG. 3A. The dummy sacrificial insulating layers and the first dummy conductive rings 171DR1 may be disposed at the same levels as the conductive patterns described in FIG. 3A, respectively.

The dummy buffer stack structure DM may be penetrated by peripheral contact holes PH. An internal diameter of each of the peripheral contact holes PH may be similar or equal to that of each first dummy conductive ring 171DR1. The peripheral contact holes PH may have a wider diameter than the cell pillars CPL illustrated in FIG. 3A.

Peripheral contact plugs 193B electrically connected to the peripheral circuit may be disposed inside the respective peripheral contact holes PH. The peripheral contact plugs 193B may have a narrower diameter than the peripheral contact holes PH.

The cell stack structures CS and the dummy buffer stack structure DM described in FIGS. 3A and 3B may be formed on a first structure, which includes the peripheral circuit and connecting structures, and a second structure, which includes a source stack structure and a dummy source stack structure. Hereinafter, the first and second structures, and the cell stack structures CS and the dummy buffer stack structure DM, which are disposed on the second structure, will be described in detail with reference to FIG. 4.

FIG. 4 illustrates cross-sectional views of a semiconductor device according to an embodiment of the present disclosure. More specifically, FIG. 4 illustrates sectional views respectively taken along lines I-I' and II-II' shown in FIG. 3A and III-III' shown in FIG. 3B.

Referring to FIG. 4, the semiconductor device may include a first structure ST1, a second structure ST2 disposed on the first structure ST1, and a third structure ST3 disposed on the second structure ST2.

The first structure ST1 may include a substrate 101, and driver transistors TR and a resistor 119, which are disposed on the substrate 101 to constitute a peripheral circuit. The driver transistors TR may be disposed on a first region (e.g., A1 of FIG. 2A) and a second region (e.g., A2 of FIG. 2A) of the substrate 101. The first structure ST1 may further include connecting structures LS.

Each of the driver transistors TR may include a gate pattern 105 and junction regions 101J. Here, the junction regions 101J, which is used as source and drain regions, may be formed by implanting dopants into the substrate 101 at both sides of the gate pattern 105. The driver transistors TR may share the junction regions 101J, or may be electrically isolated from each other by an isolation layer 103 formed inside the substrate 101. The driver transistors TR may be covered with a first insulating layer 121.

The driver transistors TR may be connected to the connecting structures LS formed in various structures. Each of the connecting structures LS may include at least one contact plug and at least one routing line. For example, each of the connecting structures LS may include a first contact plug 111, a first routing line 113 contacting a top surface of the first contact plug 111, a second contact plug 115 contacting a top surface of the first routing line 113, and a second routing line 117 contacting a top surface of the second contact plug 115. The first contact plug 111 may contact the junction region 101J of one of the driver transistors TR by penetrating the first insulating layer 121, or may contact the gate pattern 105 of one of the driver transistors TR. The first routing line 113 may penetrate a second insulating layer 123 disposed on the first insulating layer 121 to cover the first contact plug 111. The first routing line 113 may be electrically connected to one of the driver transistors TR via the first contact plug 111. The second contact plug 115 may penetrate a third insulating layer 125 disposed on the second insulating layer 123 to cover the first routing line 113. The second contact plug 115 may be electrically connected to one of the driver transistors TR via the first routing line 113 and the first contact plug 111. The second routing line 117 may penetrate a fourth insulating layer 127 disposed on the third insulating layer 125 to cover the second contact plug 115. The second routing line 117 may be electrically connected to one of the driver transistors TR via the second contact plug 115, the first routing line 113, and the first contact plug 111. The second routing line 117 may be covered with a fifth insulating layer 129 disposed on the fourth insulating layer 127.

The resistor 119 may be formed on the fifth insulating layer 129. The resistor 119 may be formed of a polysilicon layer. The resistor 119 may be disposed on the second region (e.g., A2 of FIG. 2A) of the substrate 101. The resistor 119 may penetrate a sixth insulating layer 131 disposed on the fifth insulating layer 129. The resistor 119 may be covered with a seventh insulating layer 133 formed on the sixth insulating layer 131.

The second structure ST2 may be disposed on the above-described first structure ST1. For example, the second structure ST2 may be disposed on the seventh insulating layer 133. The second structure ST2 may include a source stack structure SR and a dummy source stack structure DS, which are disposed at the same height and formed into a stack structure of different materials.

More specifically, the source stack structure SR may include a first source conductive layer 141 and a second source conductive layer 185. The first source conductive layer 141 may be formed of a material capable of serving as a growth seed layer of the second source conductive layer 185. The first source conductive layer 141 may be formed of, for example, a polysilicon material. The second source layer 185 may contact a top surface of the first source conductive layer 141, and may be disposed on the first source conductive layer 141. The second source conductive layer 185 may be formed of a doped silicon layer capable of supplying a dopant to a channel layer 167. The source stack structure SR may be disposed on the first region (e.g., A1 of FIG. 2A) of the substrate 101. The source stack structure SR may be disposed between the first structure ST1 and a cell structure CS.

The dummy source stack structure DS may include a first source conductive layer 141, a protective layer 143, and a source sacrificial layer 145. The protective layer 143 may be formed of a material that can protect the first source conductive layer 141 while an etching process is being performed to open a space for the second source conductive layer 185 of the source stack structure SR to be disposed. For example, the protective layer 143 may be formed of an oxide material. The protective layer 143 remains on the first source conductive layer 141 of the dummy source stack structure DS. The source sacrificial layer 145 may be formed of an undoped silicon material.

The dummy source stack structure DS may be penetrated by peripheral contact plugs 193B. More specifically, the peripheral contact plugs 193B may penetrate source penetrating insulating layers 147 penetrating the dummy source stack structure DS. The dummy source stack structure DS may be disposed on the second region (e.g., A2 of FIG. 2A) of the substrate 101. The dummy source stack structure DS may be disposed between the first structure ST1 and a dummy buffer stack structure DM.

The third structure ST3 may be disposed over the above-described first and second structures ST1 and ST2. The third structure ST3 may include a cell stack structure CS and a dummy buffer stack structure DM, which are isolated from each other. The cell stack structure CS and the dummy buffer stack structure DM may be disposed at the same height. The cell stack structure CS may be disposed on the first region (e.g., A1 of FIG. 2A) of the substrate 101, and the dummy buffer stack structure DM may be disposed on the second region (e.g., A2 of FIG. 2A) of the substrate 101.

The cell stack structure CS may include interlayer insulating layers 151 and conductive patterns 171G, which are alternately stacked, and cell pillars CPL penetrating the interlayer insulating layers 151 and the conductive patterns 171G. The cell pillars CPL may extend inside the source stack structure SR to penetrate a portion of the source stack structure SR. Each of the cell pillars CPL may include the channel layer 167 contacting the second source conductive layer 185, and first and second memory patterns ML1 and ML2 surrounding the channel layer 167, the first and second memory patterns ML1 and ML2 isolated by the second source conductive layer 185.

The channel layer 167 may penetrate the interlayer insulating layers 151 and the conductive patterns 171G, and may extend inside the source stack structure SR to penetrate a portion of the source stack structure SR. More specifically, the channel layer 167 may penetrate the second source conductive layer 185 and extend inside the first source conductive layer 141. The second source conductive layer 185 may contact a sidewall of the channel layer 167 and surround the channel layer 167. The channel layer 167 may be formed in a hollow shape, or may completely fill a central region of each of the cell pillars CPL. When the channel layer 167 is formed in the hollow type, each of the cell pillars CPL may further include a core insulating layer CO formed in a central region of the channel layer 167. The core insulating layer CO may be formed at a lower height than the channel layer 167. In this case, each of the cell pillars CPL may further include a capping conductive layer CAP disposed on the core insulating layer CO. Here, the capping conductive layer CAP may be surrounded by an upper end of the channel layer 167, and may contact an inner wall of the channel layer 167. The capping conductive layer CAP may be formed of a doped silicon material. The channel layer 167 may be formed of a semiconductor material such as a silicon material.

The first memory pattern ML1 may be disposed between the channel layer 167, the interlayer insulating layers 151, and conductive patterns 171G. The second memory pattern ML2 may be disposed between the first source conductive layer 141 and the channel layer 167. The first and second memory patterns ML1 and ML2 may be isolated from each other by the second source conductive layer 185. Each of the first and second memory patterns ML1 and ML2 may include a tunnel insulating layer 165 formed on an outer surface of the channel layer 167, a data storage layer 163 formed on an outer surface of the tunnel insulating layer 165, and a blocking insulating layer 161 formed on an outer surface of the data storage layer 163. The tunnel insulating layer 165 may be formed of a silicon oxide material to allow transportation of electrical charge therethrough. The data storage layer 163 may be formed of a silicon nitride material to trap electrical charges therein. The blocking insulating layer 161 may be formed of an oxide material capable of blocking electrical charges.

The conductive patterns 171G of the cell stack structure CS may be connected to gates of source select transistors SST, gates of memory cells MC, and gates of drain select transistors DST. The conductive patterns 171G connected to the source select transistors SST may be defined as source select lines. The conductive patterns 171G connected to the memory cells MC may be defined as word lines. The conductive patterns 171G connected to the drain select transistors DST may be defined as drain select lines. A plurality of memory cells MC may be stacked between the source select transistors SST and the drain select transistors DST. One or more source select transistors SST may be stacked under the memory cells MC stacked in a direction in which the channel layer 167 extends. One or more drain select transistors DST may be stacked over the memory cells MC stacked in the direction in which the channel layer 167 extends. The source select transistors SST, the memory cells MC, and the drain select transistors DST, which are stacked in the direction in which the channel layer 167 extends, may be electrically connected to each other by the channel layer 167 to form a cell string.

The cell stack structure CS may include an end portion formed in a step shape. The cell stack structure CS may be covered with a planarization insulating layer 169 covering the step-shaped end portion. The cell stack structure CS and the planarization insulating layer 169 may be penetrated by a slit insulating layer 187. The slit insulating layer 187 may cover the planarization insulating layer 169. The slit insulating layer 187 may be formed between a plurality of cell stack structures. The slit insulating layer 187 may penetrate each of the cell stack structures CS.

An insulating spacer 181 may be further formed between a sidewall of each cell stack structure CS and the slit insulating layer 187.

The slit insulating layer 187 and the planarization insulating layer 169 may be penetrated by bit line contact plugs 195. Each of the bit line contact plugs 195 may contact the channel layer 167, or may contact the capping conductive layer CAP. Although not illustrated, the bit line contact plug 195 may contact a bit line disposed thereon.

The slit insulating layer 187 and the planarization insulating layer 169 may be penetrated by cell contact plugs 193A. The cell contact plugs 193A may contact the conductive patterns 171G exposed through the step-shaped end portions of the cell stack structures CS, respectively. The cell contact plugs 193A may further penetrate the interlayer insulating layers 151. Although not illustrated, the cell contact plugs 193A may be connected to upper routing lines. The upper routing lines may be disposed on the cell contact plugs 193A.

The dummy buffer stack structure DM may include interlayer insulating layers 151 and sacrificial insulating layers 153, which are alternately stacked. The dummy buffer stack structure DM may also include first dummy conductive rings 171DR1 formed inside each of the sacrificial insulating layers 153 and the first dummy conductive rings 171DR1 stacked in a line.

The interlayer insulating layers 151 and the sacrificial insulating layers 153 of the dummy buffer stack structure DM remain as dummy layers on the second region (e.g., A2 of FIG. 2A) of the substrate 101. The interlayer insulating layers 151 and the sacrificial insulating layers 153 of the dummy buffer stack structure DM may serve as buffers capable of reducing a loading effect that may occur in a process of performing a planarization process, etc. The interlayer insulating layers 151 of the dummy buffer stack structure DM may be disposed at the same levels as the interlayer insulating layers 151 of the cell stack structures CS. The sacrificial insulating layers 153 of the dummy buffer stack structure DM may be disposed at the same levels as the conductive patterns 171G of the cell stack structures CS.

The first dummy conductive rings 171DR1 may be formed of the same material as the conductive patterns 171G of the cell stack structures CS. The first dummy conductive rings 171DR1 may be disposed at the same levels as the conductive patterns 171G of the cell stack structures. The first dummy conductive rings 171DR1 may surround the respective peripheral contact holes PH. The first dummy conductive rings 171DR1 may be stacked in a vertical direction in which the peripheral contact holes PH extends. In an embodiment, central axes of the first dummy conductive rings 171DR1 may coincide with central axes of the peripheral contact holes PH. The central axes of the first dummy conductive rings 171DR1 may be arranged in a line in which the central axes of the peripheral contact holes PH are arranged. In the cross-sectional view of the dummy buffer stack structure DM (e.g., FIG. 4), the interlayer insulating layers 151 of the dummy buffer stack structure DM may protrude from the sacrificial insulating layers 153 toward the peripheral contact holes PH. The first dummy conductive rings 171DR1 may be disposed between protruding portions of the interlayer insulating layers 151 and between the peripheral contact holes PH and the sacrificial insulating layers 153. Central holes of the first dummy conductive rings 171DR1 overlap, at least in part, the peripheral contact holes PH.

The peripheral contact holes PH may overlap, at least in part, the source penetrating insulating layers 147. In order to obtain a region wide enough for the peripheral contact plugs 193B to be disposed, a diameter of the peripheral contact holes PH may be larger than that of the cell pillars CPL. In other words, the diameter of the peripheral contact holes PH may be larger than that of the channel layer CH.

An etch stop pattern 149P may be disposed between the dummy buffer stack structure DM and the dummy source stack structure DS. The etch stop pattern 149P may be formed of a material capable of serving as an etch stop layer in a process of forming the peripheral contact holes PH. The etch stop pattern 149P may be formed of, for example, an aluminum oxide material ($Al_2O_3$).

A second dummy conductive ring 171DR2 may be disposed at the same level as the etch stop pattern 149P, and may overlap, at least in part, the first dummy conductive rings 171DR1 stacked in a line. The second dummy conductive reign 171DR2 may be formed of the same material as the first dummy conductive rings 171DR1 and the conductive patterns 171G. A central axis of the second dummy conductive ring 171DR2 may correspond to those of the first dummy conductive rings 171DR1 stacked in a line. The central axis of the second dummy conductive ring 171DR2 overlaps a central axis of any one of the peripheral contact holes PH. The peripheral contact holes PH may be respectively surrounded by the second dummy conductive rings 171DR2 formed by penetrating the etch stop pattern 149P.

In an embodiment of the present disclosure, the first dummy conductive rings 171DR1 and the second dummy conductive rings 171DR2 may remain around the peripheral contact holes PH.

The planarization insulating layer 169 and the slit insulating layer 187 may cover the dummy buffer stack structure DM. The slit insulating layer 187 may extend inside the peripheral contact holes PH. In other words, the slit insulating layer 187 may penetrate the dummy buffer stack structure DM. The slit insulating layer 187 may be formed over the insulating spacer 181 disposed on sidewalls of the peripheral contact holes PH.

The slit insulating layer 187 extending inside the peripheral contact holes PH may be penetrated by the peripheral contact plugs 193B. Since the peripheral contact plugs 193B are disposed inside the peripheral contact plugs PH, the peripheral contact plugs 193B may be surrounded by the first and second dummy conductive rings 171DR1 and 171DR2. The peripheral contact plugs 193B may be connected to the resistor 119 or may be connected to one of the connecting structures LS by extending to penetrate the source penetrating insulating layer 147 disposed under the peripheral contact holes PH. The peripheral contact plug 193 connected to one of the connecting structures LS may be electrically connected to one of the driver transistors TR via the connecting structure LS. The peripheral contact plugs 193B may further penetrate at least one of the seventh insulating layer 133, the sixth insulating layer 131, and the fifth insulating layer 129 to be connected to at least one of the resistor 119 and the connecting structures LS. Although the slit insulating layer 187 and the insulating spacer 181 are disposed between each of the peripheral contact plugs 193B and a sidewall of the dummy buffer stack structure DM, the diameter of the peripheral contact holes PH may be larger than that of the cell pillars CPL, thereby reducing a resistance of each of the peripheral contact plugs 193B.

Although not illustrated, the peripheral contact plugs 193B may be connected to the upper routing lines. The upper routing lines may be disposed on the peripheral contact plugs 193B.

Hereinafter, a manufacturing method of the semiconductor device according to an embodiment of the present disclosure will be described with reference to FIGS. 5 to 11C. FIGS. 5, 6A to 6D, 8C, 9A to 9D, 10A and 10B, and 11A to 11C are cross-sectional views taken along the same lines as FIG. 4.

Figure 5:
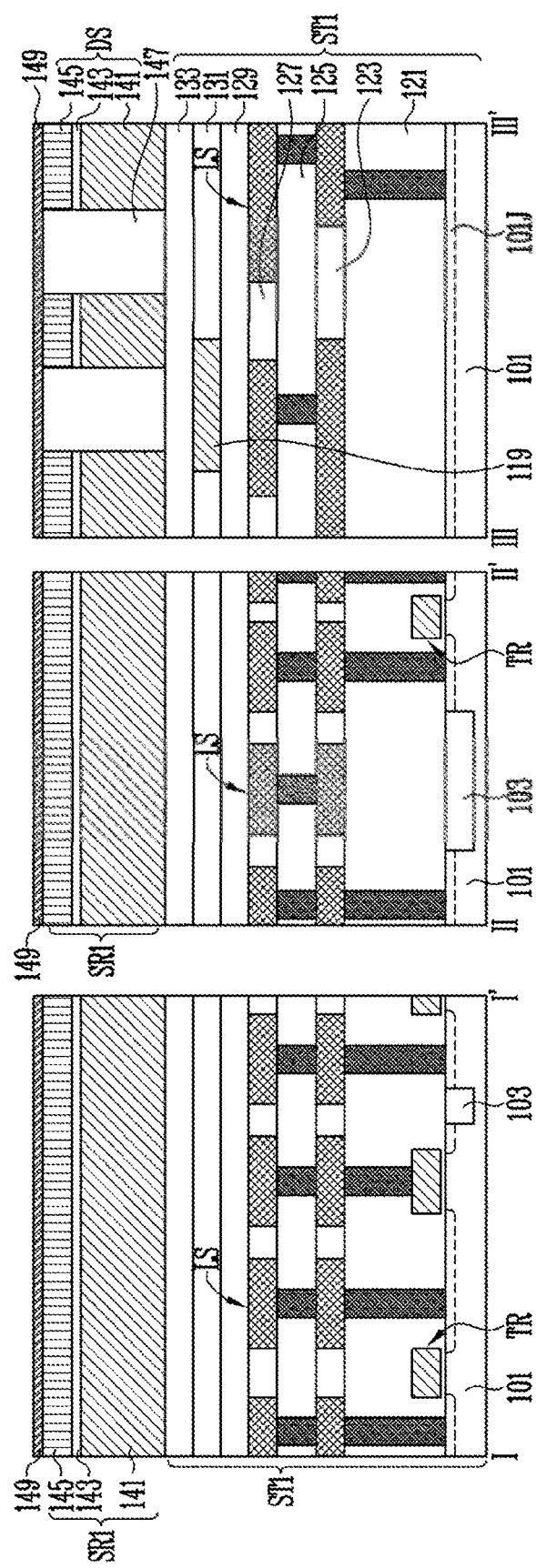

FIG. 5 is a cross-sectional view illustrating a process of forming a first structure ST1, a first source stack structure SR1, and a dummy source stack structure DS.

Referring to FIG. 5, a first structure ST1 may be formed on a substrate 101. The substrate 101 may include a first region (A1 of FIG. 2A) and a second region (A2 of FIG. 2A). The first structure ST1 may include driver transistors TR and a resistor 119, which constitute a peripheral circuit, and connecting structures LS connected to the driver transistors TR. The driver transistors TR, the resistor 119, and the connecting structures LS may be formed into the structure illustrated in FIG. 4. The driver transistors TR may be electrically isolated by an isolation layer 103 formed inside the substrate 101, or may share a junction region 101J.

The first structure ST1 may be formed by: forming the driver transistors TR; forming a first insulating layer 121 covering the driver transistors TR; forming second to fourth insulating layers 123, 125, and 127 sequentially stacked on the first insulating layer 121 and penetrated by the connecting structures LS; forming a fifth insulating layer 129 on the fourth insulating layer 127 to cover the connecting structures LS; forming a sixth insulating layer 131 stacked on the fifth insulating layer 129 and penetrated by the resistor 119; and forming a seventh insulating layer 133 on the sixth insulating layer 131.

The connecting structures LS may be formed of multi-layered conductive layers. The resistor 119 may be formed by patterning a resistor conductive layer, or may be formed through a damascene process.

After the first structure ST1 including the peripheral circuit is formed, a preliminary source stack structure may be formed on the first structure ST1. The preliminary source stack structure may include a first source conductive layer 141 and a source sacrificial layer 145 stacked on the first source conductive layer 141. The preliminary source stack structure may further include a protective layer 143 disposed between the first source conductive layer 141 and the source sacrificial layer 145.

The first source conductive layer 141 may be formed of a conductive material. The first source conductive layer 141 may be formed of a conductive material that can be used as a growth seed layer of a second source conductive layer in a subsequent process. For example, the first source conductive layer 141 may be formed of polysilicon. The first source conductive layer 141 may be formed in a multi-layered structure in which a metal layer and a polysilicon layer are stacked to reduce a resistance of a source line. The metal layer may include a material having a lower resistance than the polysilicon layer. The metal layer may include, for example, tungsten.

The protective layer 143 may be formed of a material having a different etching selection ratio from the source sacrificial layer 145. For example, the protective layer 143 may be formed of oxide.

The source sacrificial layer 145 may be formed of a material that can be selectively removed in a subsequent process. For example, the source sacrificial layer 145 may be formed of polysilicon.

After that, source penetrating insulating layers 147 penetrating the preliminary source stack structure may be formed. A portion of the source penetrating insulating layers may be divided into a first source stack structure SR1 and a dummy source stack structure DS. The first source stack structure SR1 may remain in the first region (e.g., A1 of FIG. 2A) of the substrate 101, and the dummy source stack structure SR1 may remain in the second region (e.g., A2 of FIG. 2A) of the substrate 101. Another portion of the source penetrating insulating layers 147 may be formed inside the dummy source stack structure DS to penetrate the dummy source stack structure DS in a region in which peripheral contact plugs are to be disposed. The source penetrating insulating layer 147 may be formed by: forming a source isolation mask pattern on the preliminary source stack structure; etching the preliminary source stack structure through an etching process using the source isolation mask pattern as an etch barrier; removing the source isolation mask pattern; depositing an insulating material such that an etched region of the preliminary source stack structure is filled with the insulating material; and planarizing a surface of the insulating material to expose a top surface of the preliminary source stack structure.

In an embodiment, an etch stop layer 149 may be formed on the first source stack structure SR1 and the dummy source stack structure DS to cover the source penetrating insulating layers 147. The etch stop layer 149 may be formed of a material having a different etching selection ratio from first material layers and second material layers, which are to be formed in a subsequent process. For example, the etch stop layer 149 may be formed of an aluminum oxide material (e.g., $Al_2O_3$).

FIGS. 6A to 6D are cross-sectional views illustrating a process of forming a preliminary cell stack structure and a preliminary dummy buffer stack structure. In FIGS. 6A to 6D, only uppermost patterns of the connecting structures and a structure disposed thereover are illustrated for convenience of description.

Figure 6A:
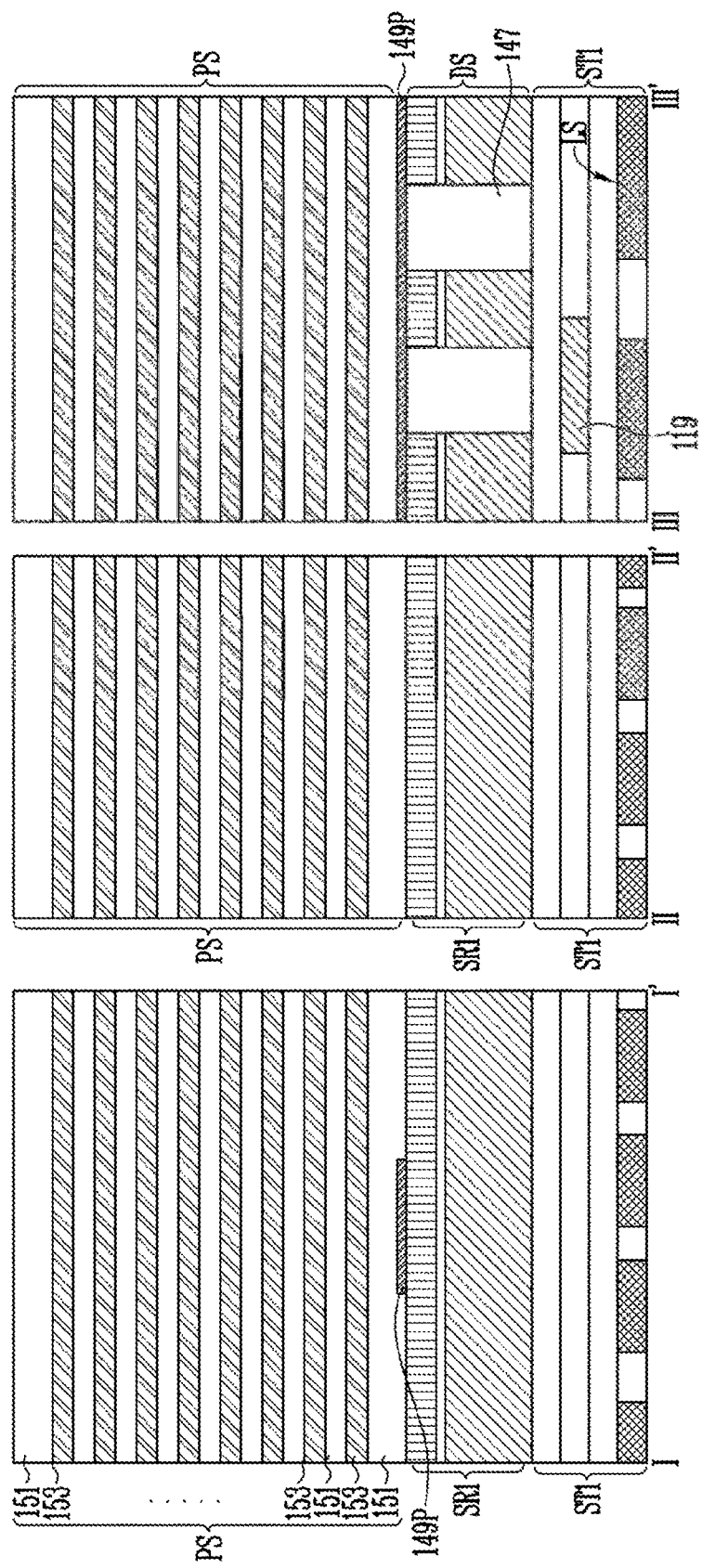

Referring to FIG. 6A, a preliminary stack structure PS may be formed on the first source stack structure SR1 and the dummy source stack structure DS by alternately stacking first material layers and second material layers. The first material layers may be used as interlayer insulating layers 151, and the second material layers may be used as sacrificial insulating layers 153. The interlayer insulating layers 151 may be formed of a silicon oxide material, and the sacrificial insulating layers 153 may be formed of a silicon nitride material.

In a case where the etch stop layer (e.g., 149 of FIG. 5) is formed in the process of FIG. 5, after an etch stop pattern 149P is formed by patterning the etch stop layer, the preliminary stack structure PS may be formed to cover the etch stop pattern 149P. The etch stop pattern 149P may be formed by removing a portion of the etch stop layer on the first region (e.g., A1 of FIG. 2A) of the substrate. The etch stop pattern 149P may remain on the second region (e.g., A2 of FIG. 2A) of the substrate, and may overlap, at least in part, a slit region. The slit region will be described later with reference to FIG. 7.

Figure 6B:
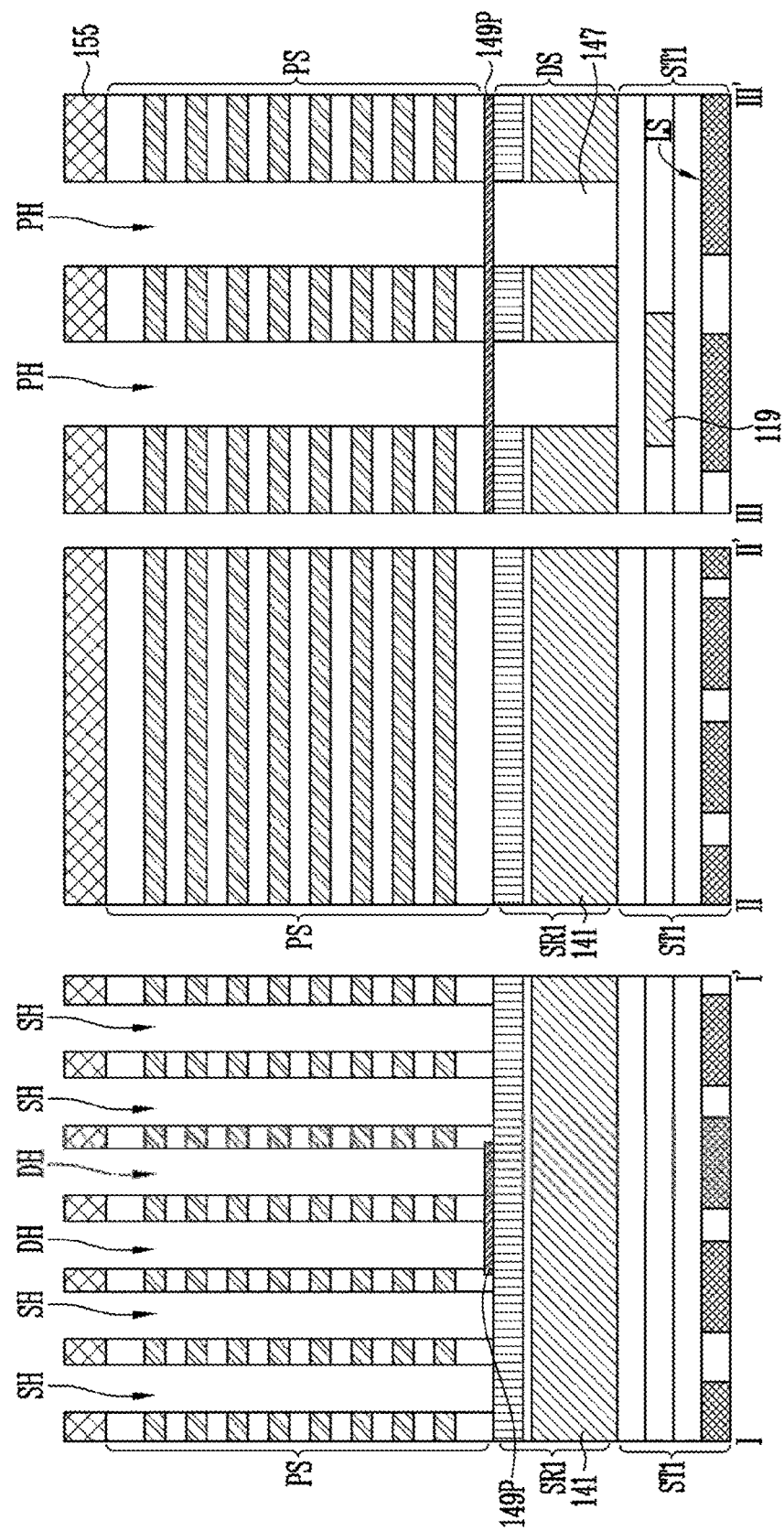

Referring to FIG. 6B, a hole mask pattern 155 may be formed on the preliminary stack structure PS. The hole mask pattern 155 may include holes for exposing some portions of the first and second regions of the substrate therethrough.

The preliminary stack structure PS may be etched through an etching process using the hole mask pattern 155 as an etch barrier. In an embodiment of the present disclosure, the shape of the hole mask pattern 155 may be defined such that holes of the hole mask pattern 155 can be uniformly and continuously distributed on the first region (A1 of FIG. 2A) of the substrate. Also, in an embodiment of the present disclosure, the hole mask pattern 155 may be defined such that, in the second region (A2 of FIG. 2A) of the substrate, some portions of the source penetrating insulating layers 147 can be exposed by the hole mask pattern 155.

According to the above-described arrangement of the holes of the hole mask pattern 155, string holes SH, dummy holes DH, and peripheral contact holes PH, which penetrate the preliminary stack structure PS, may be formed through the etching process using the hole mask pattern 155 as the etch barrier. While the preliminary stack structure PS is being etched, the etch stop pattern 149P may serve as an etch stopper. Since the holes of the hole mask pattern 155 is uniformly and continuously distributed on the first region (A1 of FIG. 2A) of the substrate, an etch rate of the preliminary stack structure PS disposed on the first region (A1 of FIG. 2A) of the substrate may be equalized through the holes of the hole mask pattern 155 while the preliminary stack structure PS is being etched. Accordingly, in an embodiment of the present disclosure, the string holes SH may have uniform sizes (e.g., diameters) regardless of distances between the string holes SH and the slit region.

The string holes SH may be divided into a plurality of matrix hole groups isolated by the slit region. The dummy holes DH may be disposed in the slit region so that the holes of the hole mask pattern 155 are uniformly distributed on the first region (A1 of FIG. 2A) of the substrate. The dummy holes DH may be disposed in one or more columns between adjacent string holes SH.

The peripheral contact holes PH are formed while the string holes SH are being formed, and therefore a mask process and an etching process for forming the peripheral contact holes PH are not added. Accordingly, in an embodiment of the present disclosure, it is possible to simplify processes.

The dummy holes DH and the peripheral contact holes PH overlap, at least in part, the etch stop pattern 149P, and the string holes SH do not overlap the etch stop pattern 149P. The dummy holes DH and the string holes SH may be disposed on the first region (A1 of FIG. 2A) of the substrate, and the peripheral contact holes PH may be disposed on the second region (A2 of FIG. 2A) of the substrate. The dummy holes DH and the string holes SH may have diameters equal or similar to each other. The peripheral contact holes PH may have a larger diameter than the dummy holes DH and the string holes SH, and may overlap, at least in part, the source penetrating insulating layers 147.

Figure 6C:
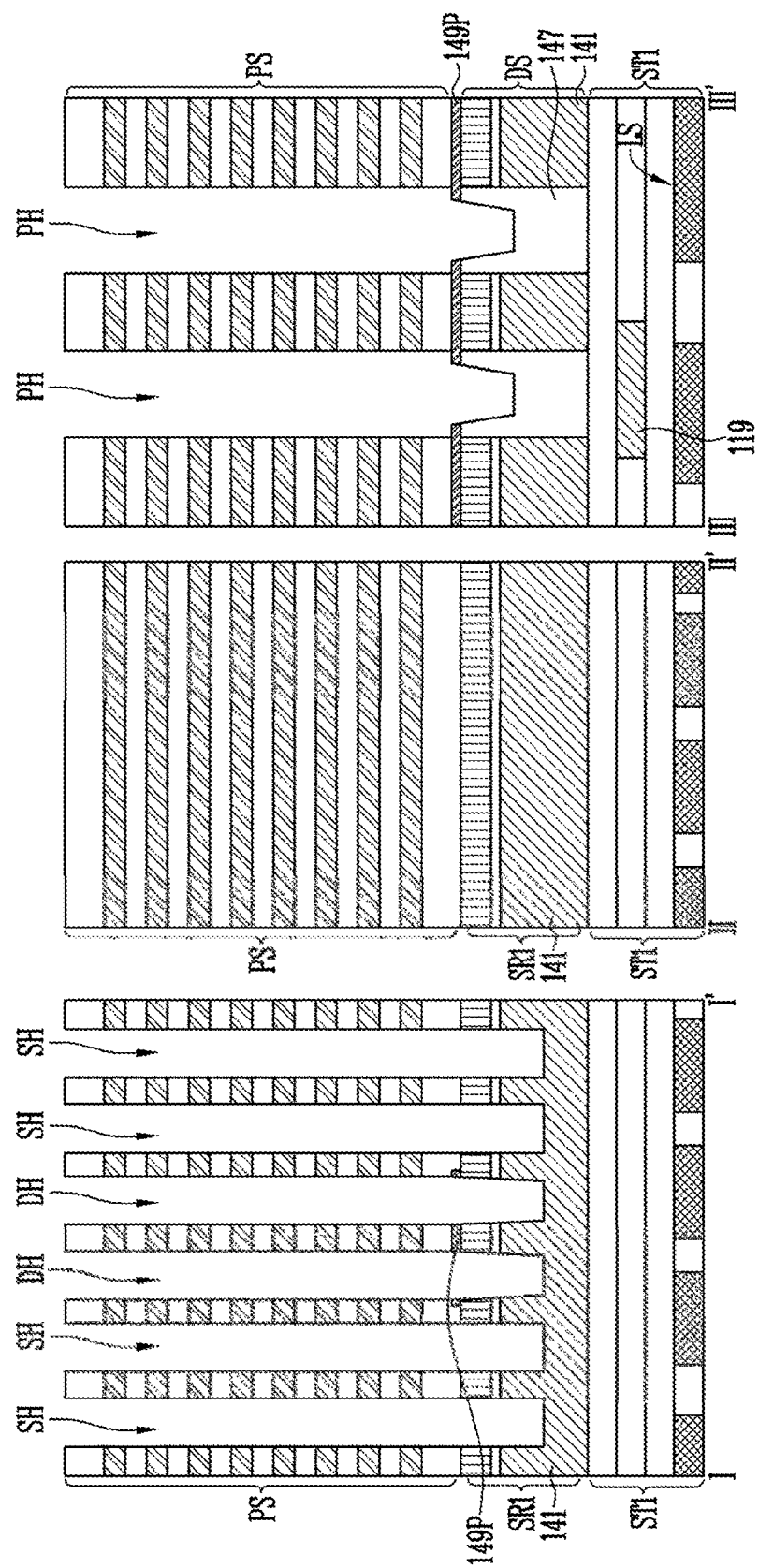

Referring to FIG. 6C, the etch stop pattern 149P, the first source stack structure SR1, and the source penetrating insulating layers 147, which are exposed through the string holes SH, the dummy holes DH, and the peripheral contact holes PH, may be etched. The string holes SH may extend inside the first source stack structure SR1. The dummy holes DH may penetrate the etch stop pattern 149P, and may extend inside the first source stack structure SR1. The peripheral contact holes PH may penetrate the etch stop pattern 149P, and may extend inside the source penetrating insulating layers 147.

After the etch stop pattern 149P, the first source stack structure SR1, and the source penetrating insulating layers 147 are etched, the hole mask pattern (155 of FIG. 6B) may be removed using a strip process and a cleaning process.

Figure 6D:
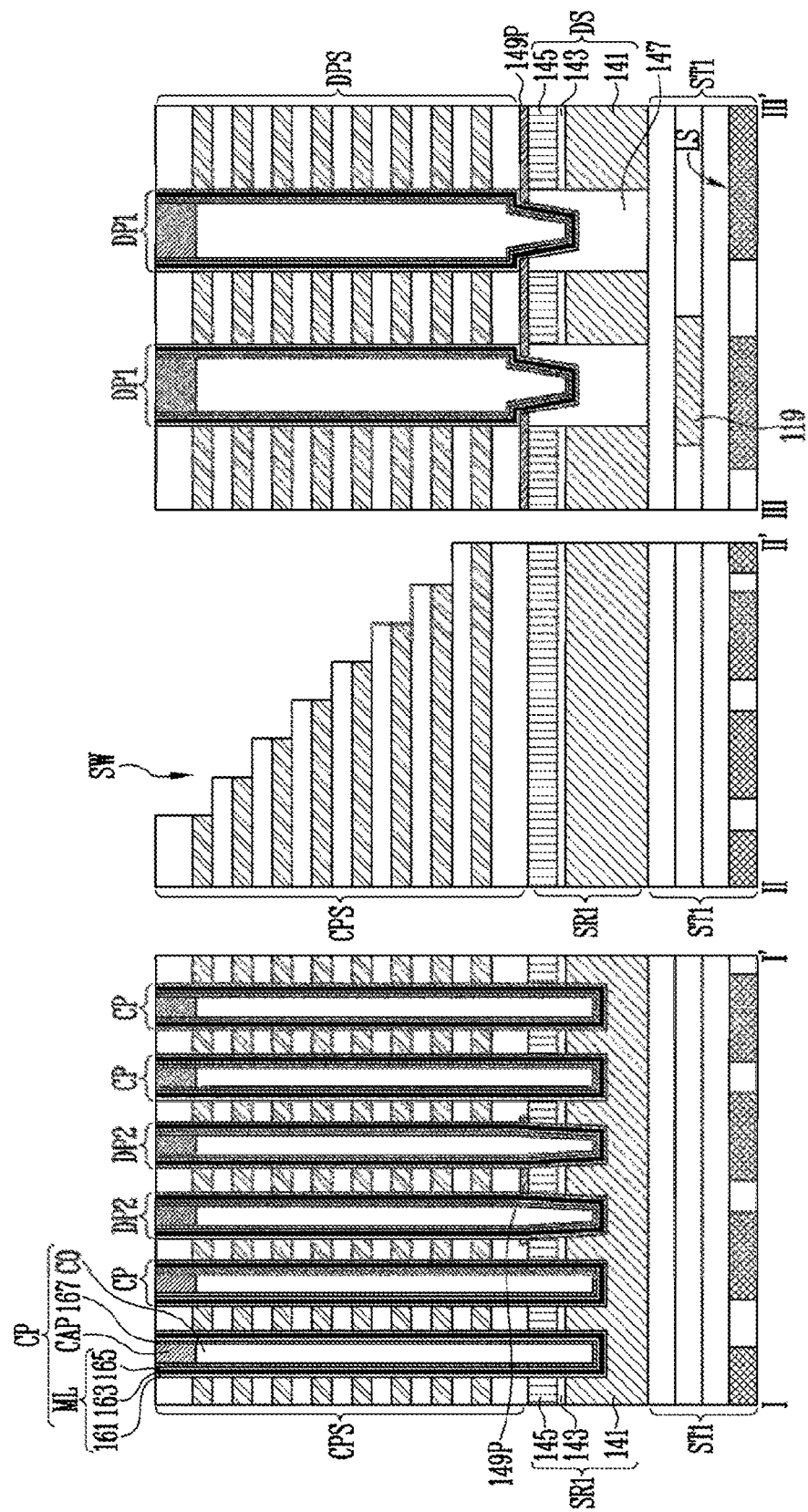

Referring to FIG. 6D, cell pillars CP filling the string holes (SH of FIG. 6C), first dummy pillars DP1 filling the peripheral contact holes (PH of FIG. 6C), and second dummy pillars DP2 filling the dummy holes (DH of FIG. 6C) may be simultaneously formed.

The arrangement and diameters of the cell pillars CP, the first dummy pillars DP1, and the second dummy pillars DP2 are based on the arrangement and diameters of the string holes, the peripheral contact holes, and the dummy holes. Specifically, the cell pillars CP may be divided into a plurality of matrix pillar groups isolated by the slit region. The second dummy pillars DP2 may be disposed in the slit region. The second dummy pillars DP2 may be disposed in one or more columns between adjacent cell pillars CP. The cell pillars CP and the second dummy pillars DP2 may penetrate the first material layers and the second material layers, which are disposed on the first region (A1 of FIG. 2A) of the substrate. The cell pillars CP may penetrate the source sacrificial layer 145 and the protective layer 143 of the first source stack structure SR1, and may extend inside the first source conductive layer 141. The second dummy pillars DP2 may penetrate the etch stop pattern 149P and the source sacrificial layer 145 and the protective layer 143 of the first source stack structure SR1, and may extend inside the first source conductive layer 141.

The first dummy pillars DP1 may have a larger diameter than the cell pillars CP and the second dummy pillars DP2. The first dummy pillars DP1 may penetrate the first material layers and the second material layers, which are disposed on the second region (A2 of FIG. 2A) of the substrate. The first dummy pillars DP1 may penetrate the etch stop pattern 149P, and may extend inside the source penetrating insulating layers 147 penetrating the dummy source stack structure DS.

Each of the cell pillars CP, the first dummy pillars DP1, and the second dummy pillars DP2 may include a channel layer 167 and a multi-layered layer ML surrounding the channel layer 167. The channel layer 167 may be formed of a semiconductor layer completely filling a space defined by the multi-layered layer ML, or may be formed of a liner-type semiconductor layer on a surface of the multi-layered layer ML. When the channel layer 167 is formed in a liner type, a region exposed by the liner-type channel layer 167 may be filled with a core insulating layer CO. As a portion of the core insulating layer CO is removed, the core insulating layer CO may remain at a lower height than the liner-type channel layer 167. In this case, a capping conductive layer CAP may be disposed on the core insulating layer CO. The capping conductive layer CAP may be surrounded by an upper end of the liner-type channel layer 167, and may contact the liner-type channel layer 167. The capping conductive layer CAP may be formed of a doped silicon material.

The multi-layered layer ML may include a tunnel insulating layer 165 surrounding the channel layer 167, a data storage layer 163 surrounding the tunnel insulating layer 165, and a blocking insulating layer 161 surrounding the data storage layer 163.

Subsequently, the first material layers and the second material layers may be etched, thereby forming a step structure SW.

According to the above-described processes, a preliminary cell stack structure CPS may include the first material layers and the second material layers, which are alternately stacked on the first source stack structure SR1. Here, the first material layers and the second material layers may have end portions patterned in the step structure SW, and may be penetrated by the cell pillars CP and the second dummy pillars DP2. A preliminary dummy buffer stack structure DPS may include the first material layers and the second material layers, which are alternately stacked on the dummy source stack structure DS penetrated by the source penetrating insulating layers 147, and may be penetrated by the first dummy pillars DP1.

FIG. 7 is a plan view illustrating an arrangement of the cell pillars CP and the second dummy pillars DP2, which penetrate the slit region SIA and the preliminary cell stack structure CPS.

Referring to FIG. 7, the cell pillars CP may be grouped into a first matrix pillar group PM1 and a second matrix pillar group PM2, which are spaced apart from each other. The slit region SIA may be interposed between the first and second matrix pillar groups PM1 and PM2. The cell pillars CP of each of the first and second matrix pillar groups PM1 and PM2 may be arranged in a zigzag manner, and may penetrate the preliminary cell stack structure CPS patterned in the step structure SW.

The second dummy pillars DP2 may penetrate the preliminary cell stack structure CPS disposed between the first and second matrix pillar groups PM1 and PM2, and may be disposed in the slit region SIA.

Figure 8A:
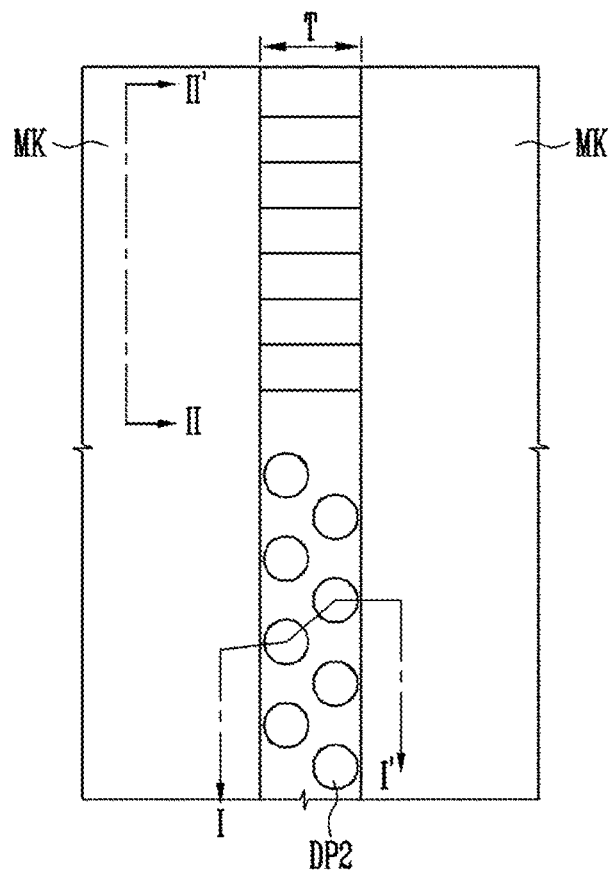
Figure 8B:
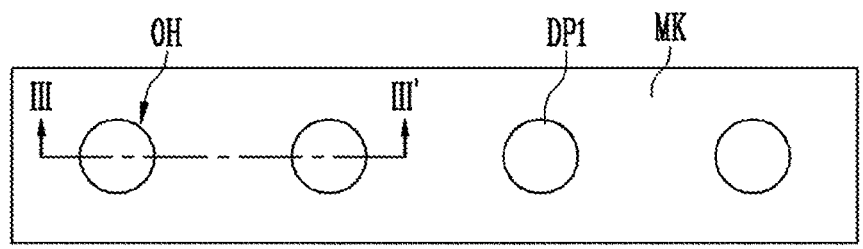
Figure 8C:
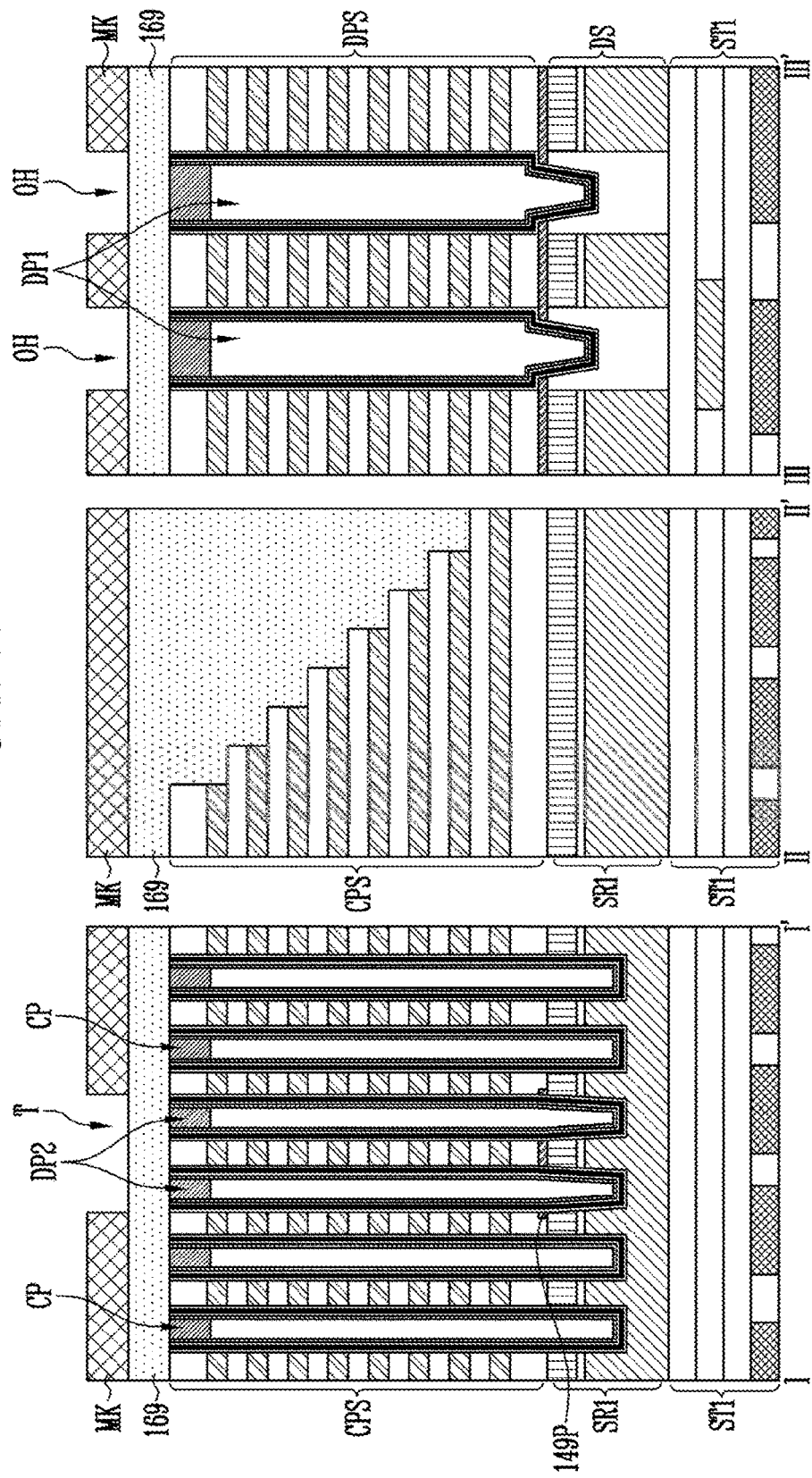

FIGS. 8A to 8C are views illustrating a process of forming a trench-hole mask pattern MK. Specifically, FIG. 8A is a plan view illustrating a partial shape of the trench-hole mask pattern MK disposed on the first region (A1 of FIG. 2A) of the substrate. FIG. 8B is a plan view illustrating a partial shape of the trench-hole mask pattern MK disposed on the second region (A2 of FIG. 2A) of the substrate. FIG. 8C may illustrate sectional views respectively taken along lines I-I' and II-II' illustrated in FIG. 8A and III-III' illustrated in FIG. 8B. For convenience of illustration, a planarization insulating layer 169 is not illustrated in FIG. 8A.

Referring to FIGS. 8A to 8C, before the trench-hole mask pattern MK is formed, the planarization insulating layer 169 may be formed to cover the preliminary cell stack structure CPS and the preliminary dummy buffer stack structure DPS. After that, the trench-hole mask pattern MK may be disposed on the planarization insulating layer 169.

The trench-hole mask pattern MK may include a trench T and holes OH. The trench T may extend along one direction to expose at least parts of a plurality of second dummy pillars DP2. More specifically, the trench T may extend along the slit region (SIA of FIG. 7). The holes OH may be disposed to respectively expose at least parts of the first dummy pillars DP1. The trench-hole mask pattern MK may block the first region at both sides of the trench T to cover the cell pillars CP. The trench T may expose some portions of the etch stop pattern 149P.

FIGS. 9A to 9D are cross-sectional views illustrating a process of forming a cell stack structure CS and a dummy buffer stack structure DM.

Figure 9A:
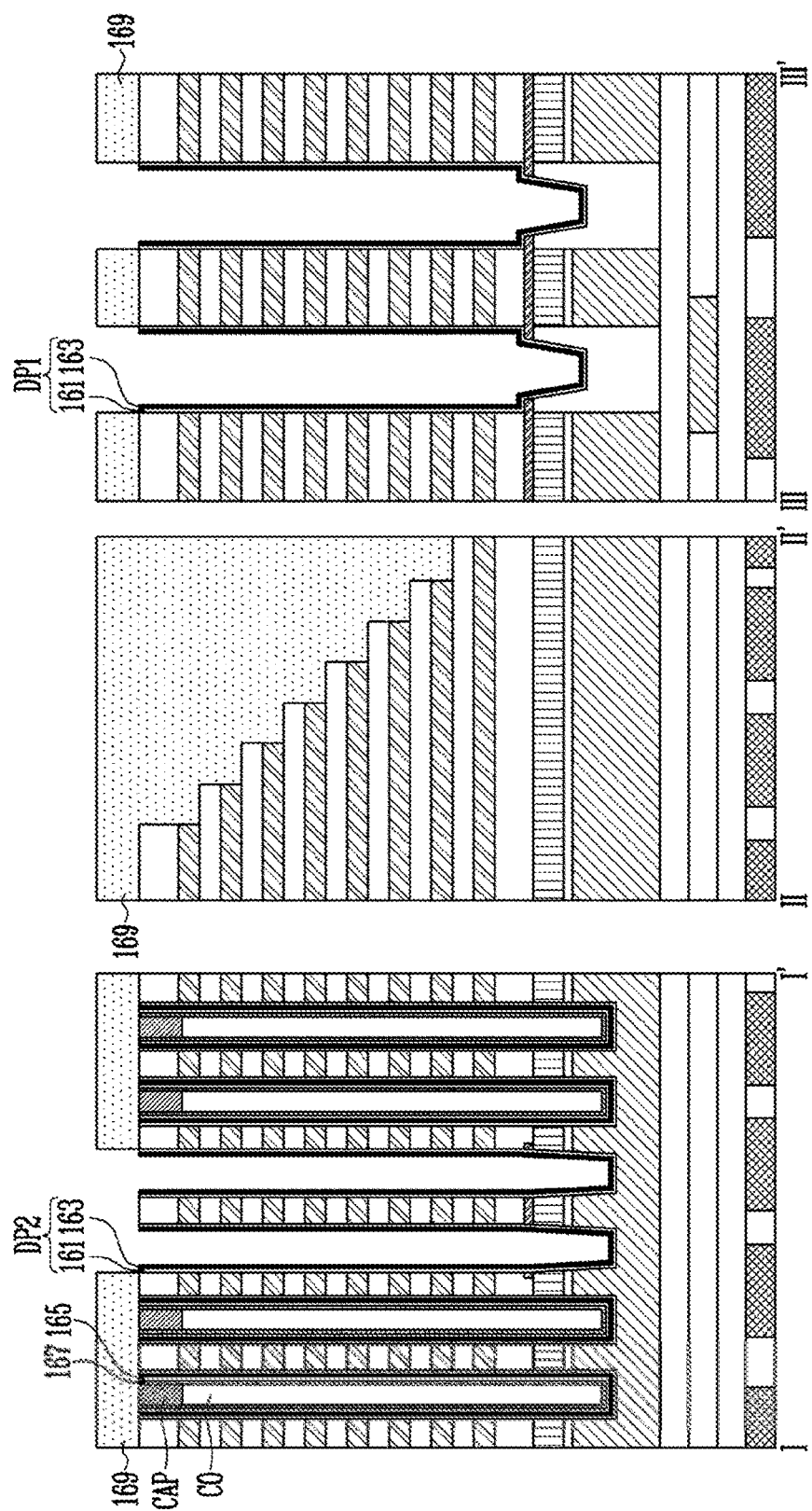

Referring to FIG. 9A, the planarization insulating layer 169 may be etched through an etching process using, as an etch barrier, the trench-hole mask pattern MK described in FIGS. 8A to 8C, thereby exposing the first and second dummy pillars DP1 and DP2. At this time, the trench and the holes, defined by the trench-hole mask pattern MK, may be defined inside the planarization insulating layer 169. The second dummy pillars DP2 may be exposed by the trench defined inside the planarization insulating layer 169, and the first dummy pillars DP1 may be respectively exposed by the holes defined inside the planarization insulating layer 169.

Subsequently, the first dummy pillars DP1 and the second dummy pillars DP2 are simultaneously removed through a wet etching process and a cleaning process using fluoric acid (HF). In this case, the capping insulating layer CAP, the core insulating layer CO, the channel layer 167, and the tunnel insulating layer 165 may be removed. After that, the trench-hole mask pattern may be removed. Alternatively, at least a part of the trench-hole mask pattern may remain.

Figure 9B:
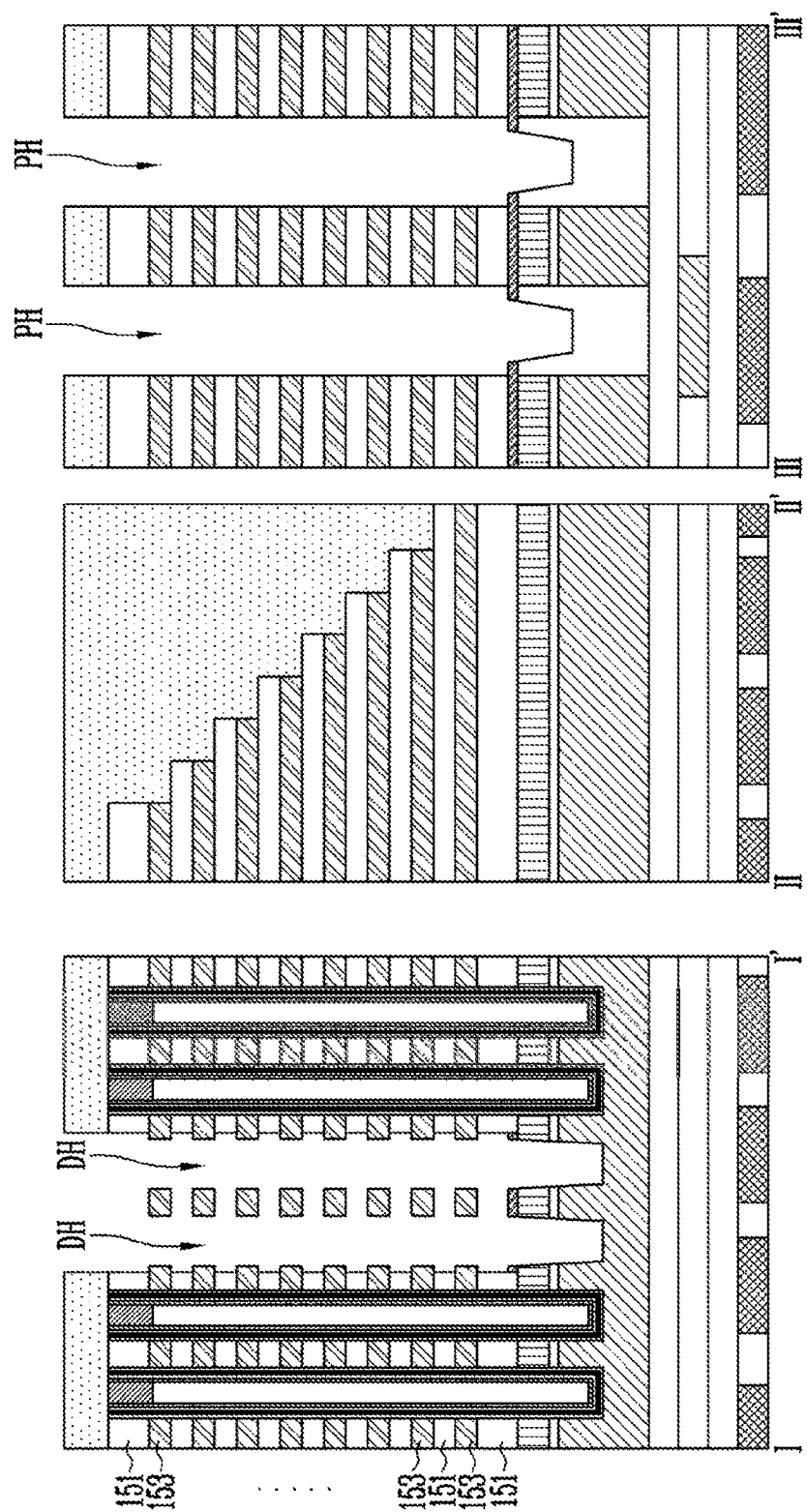

After that, the data storage layer 163 and the blocking insulating layer 161 of each of the first dummy pillars DP1 and the second dummy pillars DP2 are removed, so that the dummy holes DH and the peripheral contact holes PH are formed as illustrated in FIG. 9B. Portions of the first material layers (e.g., the interlayer insulating layers 151) around the dummy holes DH may be removed along the shapes of the dummy holes DH while the first dummy pillars DP1 and the second dummy pillars DP2 is being removed. The process of removing the first dummy pillars DP1 and the second dummy pillars DP2 may be performed to open the dummy holes DH and the peripheral holes PH.

Referring to FIG. 9C, the first material layers and the second material layers (e.g., the interlayer insulating layers 151 and the sacrificial insulating layers 153 of FIG. 9B) in the slit region, exposed through the trench-hole mask pattern or a trench of the planarization insulating layer 169, may be removed. Accordingly, a slit SI is formed on the first region (A1 of FIG. 2A) of the substrate. After that, when the trench-hole mask pattern remains, the trench-hole mask pattern may be removed.

Subsequently, the second material layers (e.g., the sacrificial insulating layers 153) in the first region may be removed through the slit SI, thereby exposing gate regions GA. In this case, a portion of each of the second material layers (i.e., the sacrificial insulating layers 153) on the second region, exposed through the peripheral contact holes PH, may be removed, thereby exposing first ring regions RA1. In addition, while the second material layers are being removed, the etch stop pattern 149P exposed to a bottom surface of the slit SI may be removed, and a portion of the etch stop pattern 149P on the second region, exposed through the peripheral contact holes PH, may be removed. Accordingly, the slit SI extending to expose the source sacrificial layer 145 may be formed, and second ring regions RA2 extending toward the etch stop pattern 149P from the peripheral contact holes PH may be defined. The second ring regions RA2 overlap, at least in part, the first ring regions RA1.

Figure 9D:
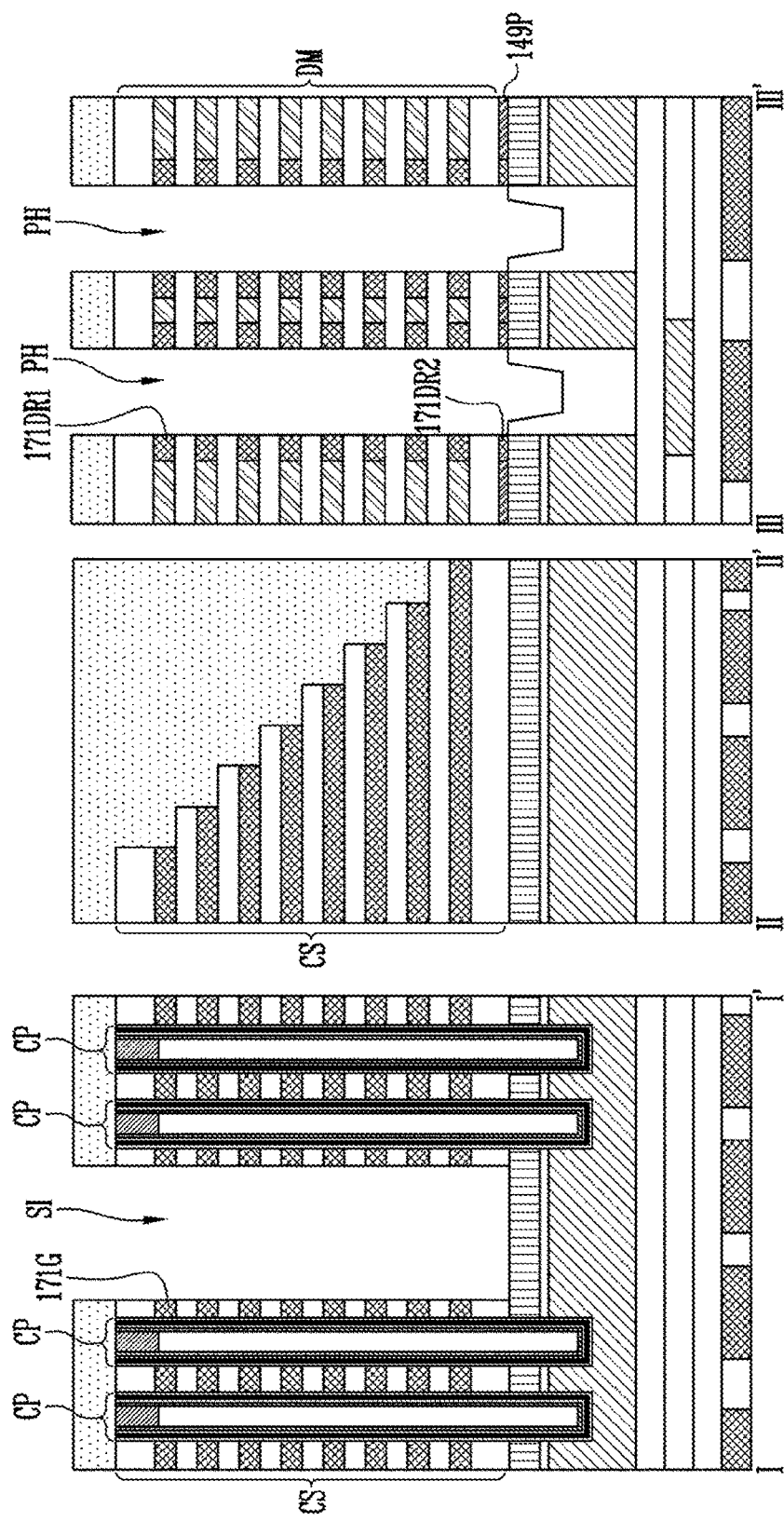

The gate regions GA, the first ring regions RA1, and the second ring regions RA2 may be filled with third material layers as illustrated in FIG. 9D. The third material layers may include a conductive material. More specifically, the third material layers may be divided into conductive patterns 171G formed in the gate regions GA, first dummy conductive rings 171DR1 formed in the first ring regions RA1, and second dummy conductive rings 171DR2 formed in the second ring regions RA2. The third material layers may include a conductive material having a low resistance such as tungsten.

According to a series of processes described in FIGS. 9A to 9D, the cell stack structure CS penetrated by the slit SI may be disposed on the first region (A1 of FIG. 2A) of the substrate, and the dummy buffer stack structure DM penetrated by the peripheral contact holes PH may be disposed on the second region (A2 of FIG. 2A) of the substrate. The cell structure CS includes the first material layers and the third material layers, which are alternately stacked while surrounding the cell pillars CP. The dummy buffer stack structure DM may include the first material layers and the second material layers, which are alternately stacked, and the third material layers extending toward sidewalls of the second material layers from a sidewall of each of the peripheral contact holes PH. The cell stack structure CS and the dummy buffer stack structure DM may be formed by replacing the second material layers of the preliminary cell stack structure and the preliminary dummy buffer stack structure with the third material layers. While the second material layers of the preliminary dummy buffer stack structure are being replaced with the third material layers, a portion of the etch stop pattern 149P under the preliminary dummy buffer stack structure may be replaced with the third material layers through the peripheral contact holes PH.

The cell stack structure CS does not overlap the etch stop pattern 149P, and the dummy buffer stack structure DM may overlap, at least in part, the etch stop pattern 149P.

Figure 10B:
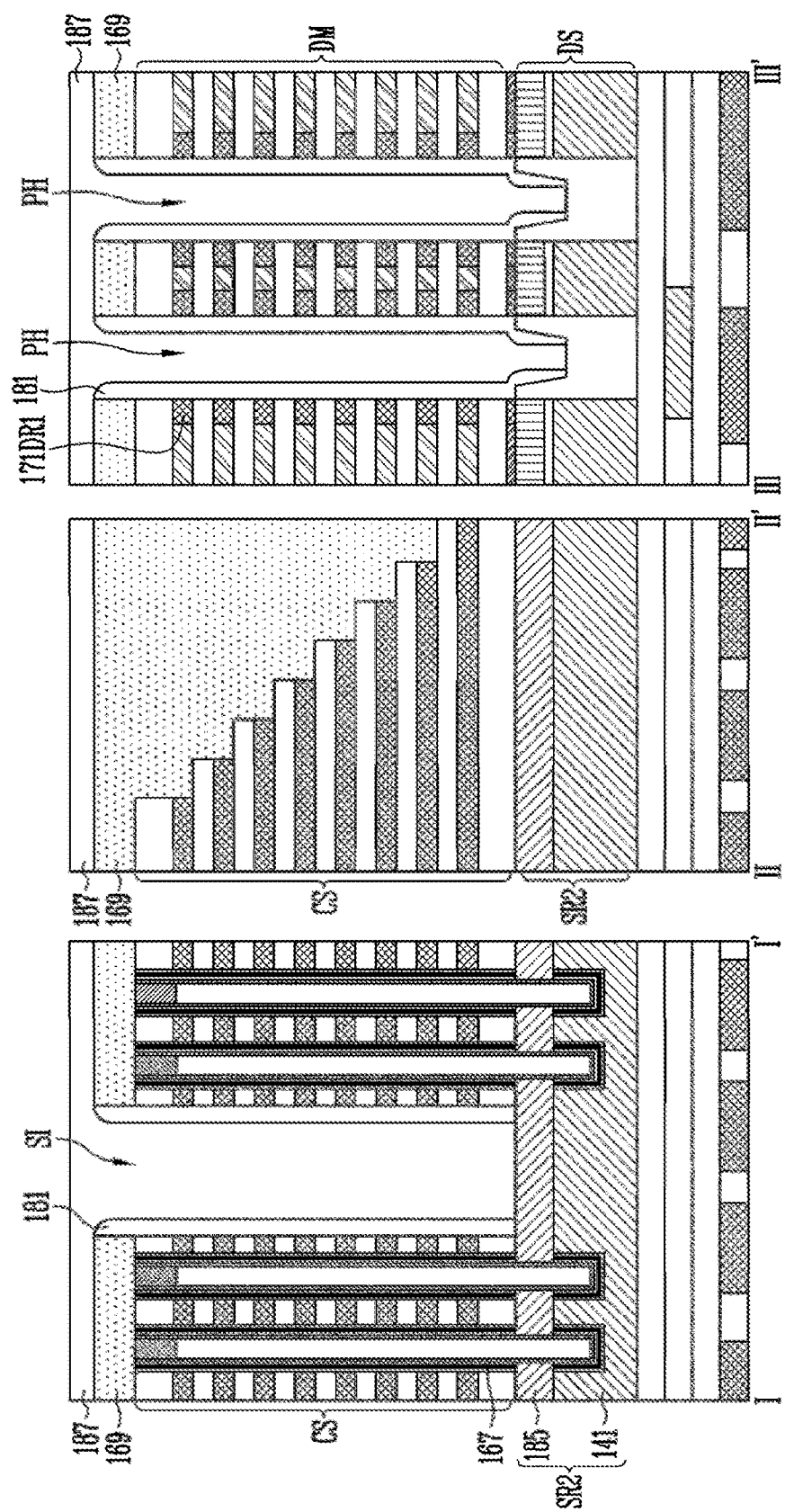

FIGS. 10A and 10B are cross-sectional views illustrating a process of forming a second source stack structure SR2. The second source stack structure SR2 may correspond to the source stack structure SR described in FIG. 4.

Referring to FIG. 10A, spacer insulating layers 181 may be formed on sidewalls of the slit SI and the peripheral contact holes PH, respectively. The spacer insulating layers 181 protect the cell stack structure CS or the dummy buffer stack structure DM from being removed in an etch process, and may be formed of a material capable of serving as an etch barrier during a subsequent process of removing the source sacrificial layer. For example, the space insulating layers 181 may be formed of a nitride material.

Subsequently, the source sacrificial layer disposed under the cell stack structure CS may be removed. When the source sacrificial layer is removed, the cell stack structure CS and the dummy buffer stack structure DM may be protected by the spacer insulating layers 181. At this time, the dummy source stack structure DS is not exposed, and thus its stack structure can be maintained.

An opening SA may be defined in a region from which the source sacrificial layer is removed. Subsequently, the protective layer disposed under the cell stack structure CS, a portion of the blocking insulating layer 161 of each of the cell pillars CP, a portion of the data storage layer 163, and a portion of the tunnel insulating layer 165 may be removed through the opening SA. Accordingly, the opening SA may extend towards the sidewall of each of the cell pillars CP to expose the sidewall of the channel layer 167 of each of the cell pillars CP. Also, the opening SA may expose the first source conductive layer 141. In addition, the blocking insulating layer 161, the data storage layer 163, and the tunnel insulating layer 165 of each of the cell pillars CP may be divided into a first memory pattern ML1 and a second memory pattern ML2.

After that, the opening SA is filled with a conductive material, so that a second source conductive layer 185 connecting the channel layer 167 and the first source conductive layer 141 to each other is formed as shown in FIG. 10B. The second source conductive layer 185 may be a layer grown from the channel layer 167 and the first source layer 141. Alternatively, the second source conductive layer 185 may be formed by depositing a conductive layer inside the opening SA.

The second source stack structure SR2 including the first source conductive layer 141 and the second source conductive layer 185 may be formed on the first region (A1 of FIG. 2A) through a series of processes described in FIGS. 10A and 10B. While the second source stack structure SR2 is being formed, the stack structure of the dummy source stack structure DS may be maintained.

After the second source stack structure SR2 is formed, a slit insulating layer 187 may formed on the planarization insulating layer 169 to fill the slit SI and the peripheral contact holes PH.

Figure 11A:
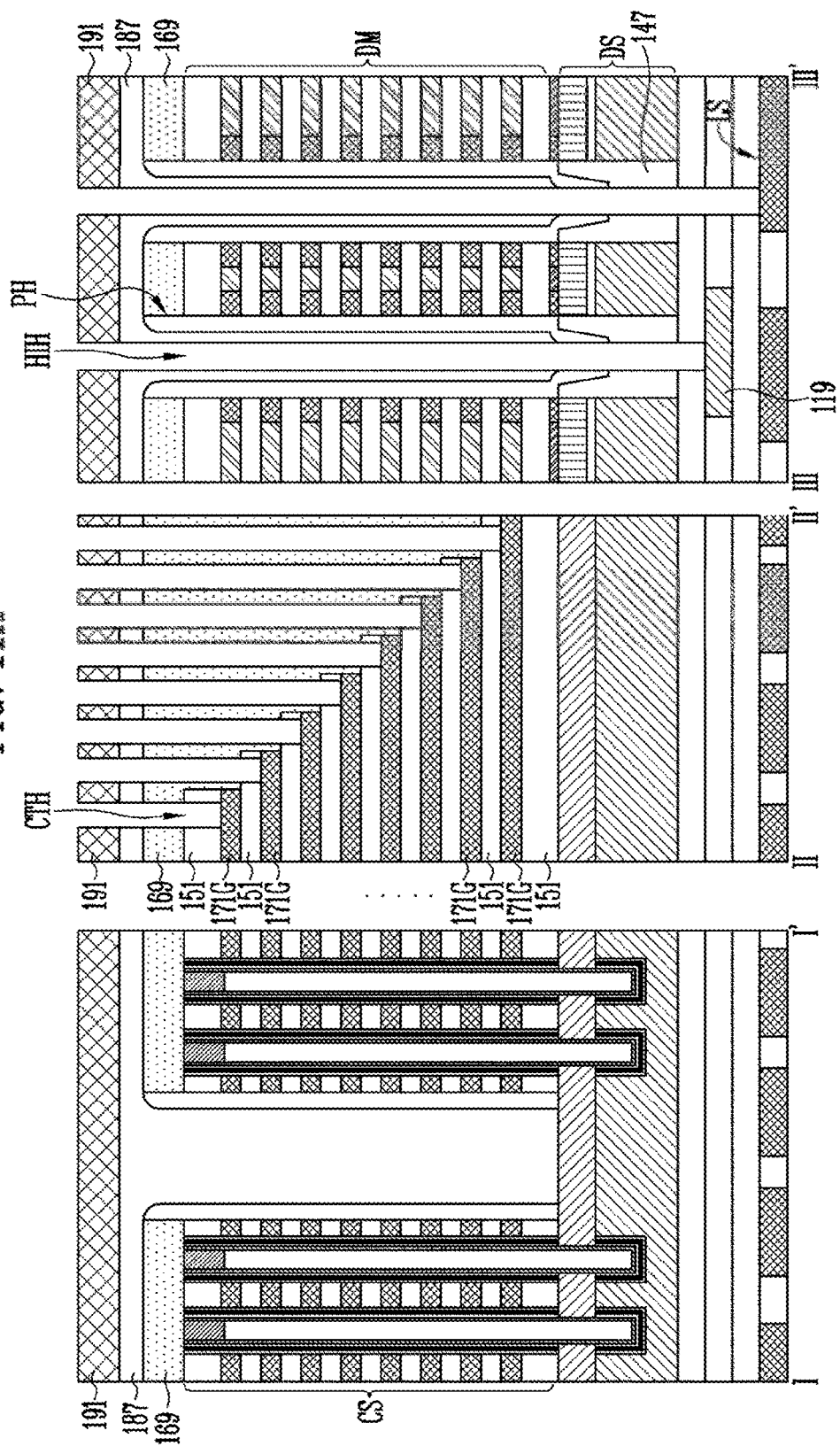
Figure 11B:
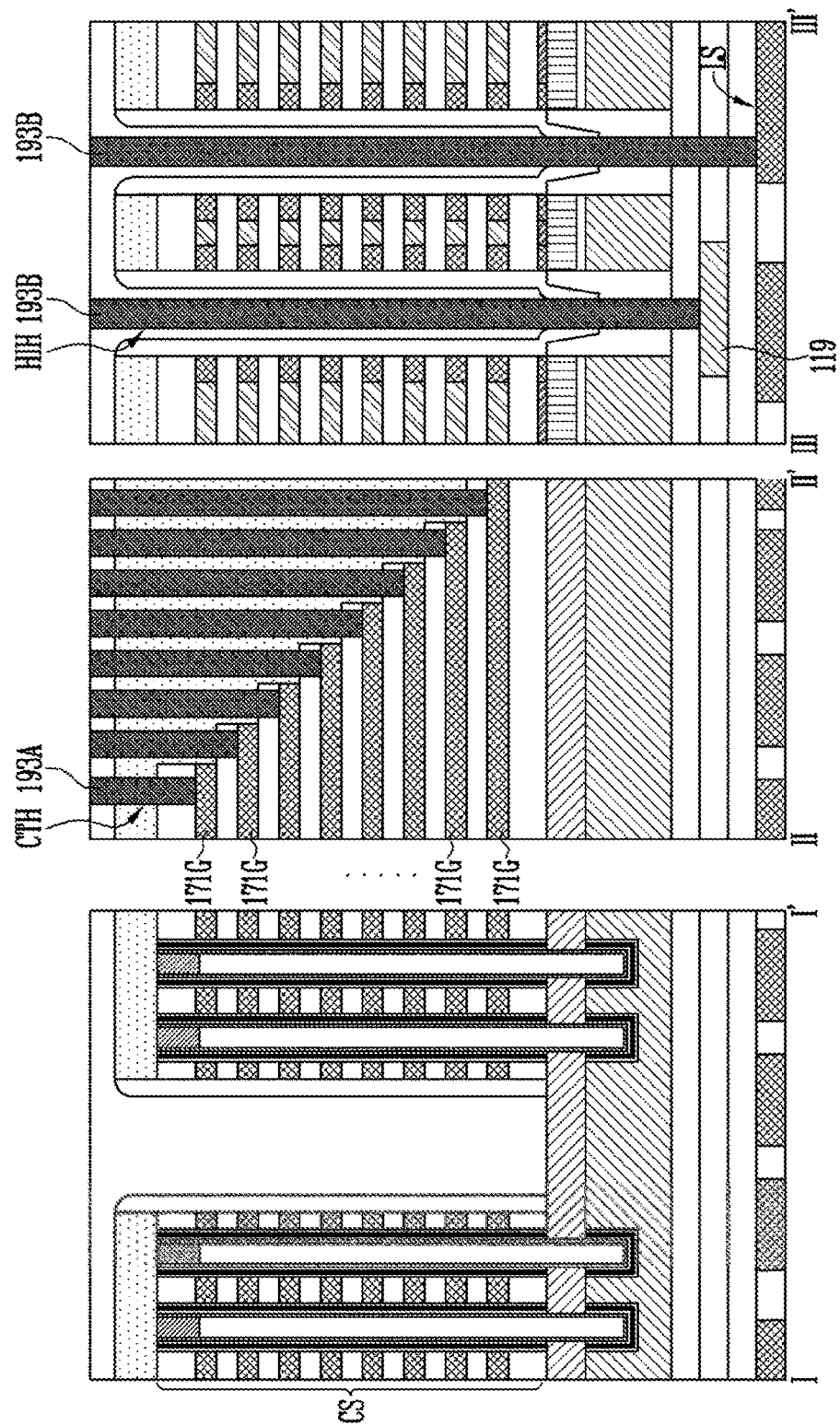

FIGS. 11A to 11C are cross-sectional views illustrating a process of forming contact plugs 193A, 193B, and 195.

Referring to FIG. 11A, a contact hole mask pattern 191 may be formed on the slit insulating layer 187. The contact hole mask pattern 191 may expose the conductive patterns 171G of the cell stack structure CS on the step structure to form the peripheral contact holes PH.

Subsequently, the slit insulating layer 187, the planarization insulating layer 169, and the source penetrating insulating layers 147 may be etched through an etching process using the contact hole mask pattern 191 as an etch barrier, thereby forming cell contact holes CTH and inside holes HIH. The cell contact holes CTH may expose the conductive patterns 171G constituting the step structure of the cell stack structure CS, respectively. The inside holes HIH may be disposed inside the respective peripheral contact holes PH, and may expose the resistor 119 or may expose one of the connecting structures.

Because the preliminary stack structure and the preliminary source stack structure in a region in which the inside holes HIH are to be disposed were previously removed through the previous processes, the inside holes HIH may be formed together with the cell contact holes CTH using the same mask process.

The contact hole mask pattern 191 may be removed after the cell contact holes CTH and the inside holes HIH are formed.

Referring to FIG. 11B, each of the cell contact holes CTH and the inside holes HIH illustrated in FIG. 11A may be filled with a conductive material. Accordingly, peripheral contact plugs 193B that directly contact the resistor 119 of the peripheral circuit or directly contact at least one of the connecting structures LS electrically connected to the peripheral circuit may be formed inside the inside holes HIH. In addition, cell contact plugs 193A directly contacting the conductive patterns 171G of the cell stack structure CS may be formed inside the cell contact holes CTH. According to an embodiment of the present disclosure, the cell contact plugs 193A and the peripheral contact plugs 193B may be simultaneously formed.

Referring to FIG. 11C, bit line contact plugs 195 may directly contact the capping conductive layers CAP by penetrating the slit insulating layer 187 and the planarization insulating layer 169. After that, subsequent processes for forming interconnects such as bit lines and upper routing lines may be performed.

According to an embodiment of the present disclosure, portions of the second material layers adjacent to the peripheral contact holes may be replaced with the third material layers, and thus the semiconductor device may include the dummy conductive rings surrounding the peripheral contact holes.

According to an embodiment of the present disclosure, the source sacrificial layer of the dummy source stack structure, disposed under the dummy buffer stack structure, is not replaced with the source conductive layer. Accordingly, the dummy source stack structure of the semiconductor device may be formed into a stack structure including different materials from the source stack structure disposed under the cell stack structure.

Figure 12:
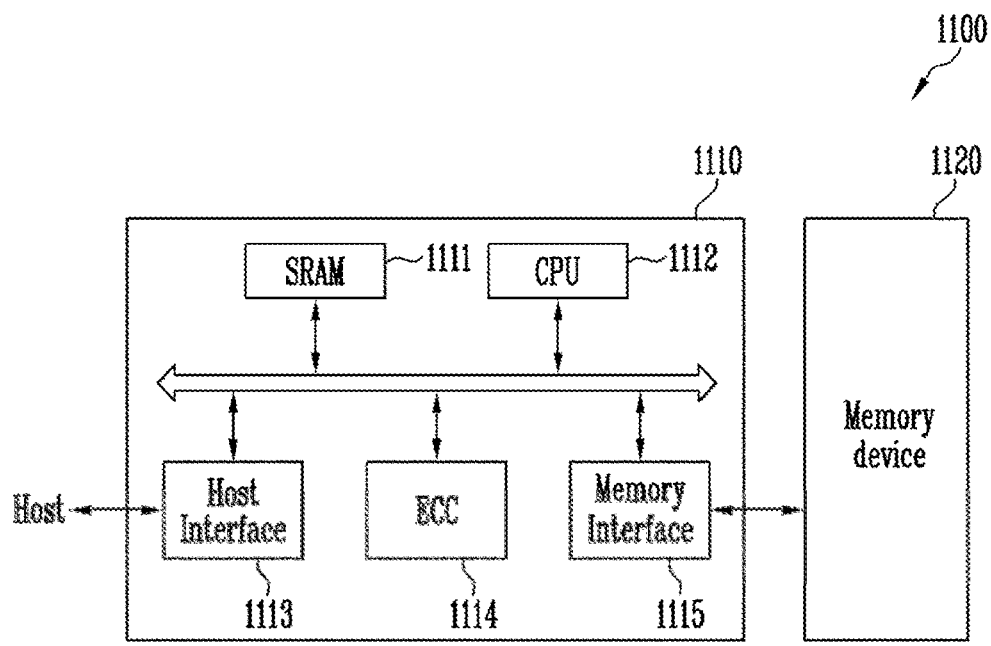
FIG. 12 is a diagram illustrating a configuration of a memory system according to an embodiment of the present disclosure.

FIG. 12 is a diagram illustrating an example configuration of a memory system according to an embodiment of the present disclosure.

Referring to FIG. 12, the memory system 1100 according to an embodiment of the present disclosure may include a memory device 1120 and a memory controller 1110.

The memory device 1120 may include the structure described in FIGS. 1 to 4. For example, the memory device 1120 may include a dummy buffer stack structure including dummy conductive rings disposed on a peripheral circuit, the dummy conductive rings stacked in a line, and peripheral contact plugs extending inside central holes of the dummy conductive rings to be electrically connected to the peripheral circuit. Also, the memory device 1120 may include a source stack structure disposed between the peripheral circuit and a cell stack structure, and a dummy source stack structure disposed between the peripheral circuit and the dummy buffer stack structure, the dummy source stack structure formed into a different stack structure from the source stack structure. The memory device 1120 may be formed using the processes described in FIGS. 6A to 11C.

The memory device 1120 may be a multi-chip package formed of a plurality of flash memory chips.

The memory controller 1110 may control the memory device 1120, and may include a static random access memory (SRAM) 1111, a central processing unit (CPU) 1112, a host interface 1113, an error correction code (ECC) block 1114, and a memory interface 1115. The SRAM 1111 may be used as an operation memory of the CPU 1112. The CPU 1112 may perform general control operations so that the memory controller 1110 may exchange data. The host interface 1113 may include a data exchange protocol for a host coupled to the memory system 1100 to perform data communications. Also, the ECC block 1114 may detect and correct errors included in a data read from the memory device 1120, and the memory interface 1115 may interface with the memory device 1120. In addition, the memory controller 1110 may further include a read only memory (ROM) for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1100 may communicated with an external device (e.g., the host) through an interface protocol such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 13:
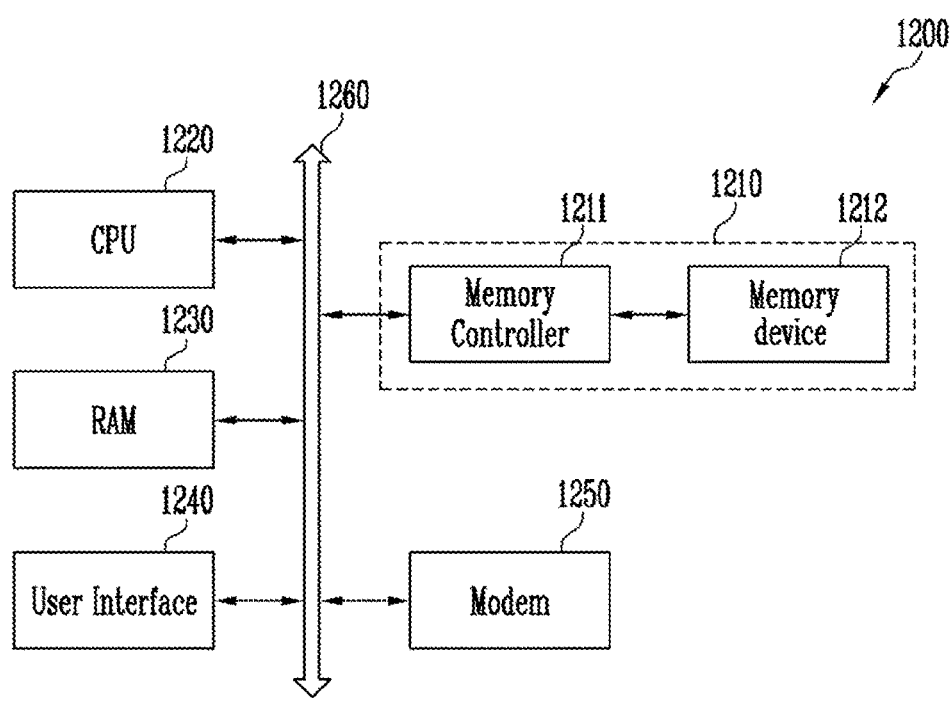
FIG. 13 is a diagram illustrating a configuration of a computing system according to an embodiment of the present disclosure.

FIG. 13 is a diagram illustrating an example configuration of a computing system according to an embodiment of the present disclosure.

Referring to FIG. 13, the computing system 1200 according to an embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 12, may be configured with a memory device 1212 and a memory controller 1211.

According to an embodiment of the present disclosure, a peripheral contact hole may be primarily defined in a process of forming a dummy pillar. The process of forming the dummy pillar may be performed using a process of etching first material layers and second material layers in a cell region, and the dummy pillar may be removed in a process of forming a slit. Accordingly, it is unnecessary to remove the first material layers and the second material layer through a separate etching process in the process of forming the peripheral contact plug, and thus it is possible to simplify the process of forming the peripheral contact plug.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
    a first structure including a substrate and a peripheral circuit disposed on the substrate;
    a dummy buffer stack structure disposed on the first structure, the dummy buffer stack structure including dummy interlayer insulating layers and dummy sacrificial insulating layers, which are alternately stacked, and first dummy conductive rings stacked in a line inside the respective dummy sacrificial insulating layers;
    a peripheral contact hole penetrating the dummy buffer stack structure, the peripheral contact hole being surrounded by the first dummy conductive rings; and
    a peripheral contact plug disposed in the peripheral contact hole, the peripheral contact plug extending to be connected to the peripheral circuit,
    wherein the first dummy conductive rings are disposed between the peripheral contact plug and the dummy sacrificial insulating layers.

2. The semiconductor device of claim 1, further comprising:
    a dummy source stack structure disposed between the first structure and the dummy buffer stack structure; and
    a source penetrating insulating layer penetrating the dummy source stack structure disposed under the peripheral contact hole, the peripheral contact plug penetrating the source penetrating insulating layer.

3. The semiconductor device of claim 2, wherein the dummy source stack structure includes:
    a first source conductive layer;
    a protective layer formed on the first source conductive layer; and
    a source sacrificial layer formed on the protective layer.

4. The semiconductor device of claim 2, further comprising:
    an etch stop pattern disposed between the dummy source stack structure and the dummy buffer stack structure; and
    a second dummy conductive ring disposed at the same level as the etch stop pattern, the second dummy conductive ring overlapping, at least in part, the first dummy conductive rings.

5. The semiconductor device of claim 1, wherein the peripheral circuit includes a resistor electrically connected to the peripheral contact plug.

6. The semiconductor device of claim 1, wherein the peripheral circuit includes a driver transistor electrically connected to the peripheral contact plug via a connecting structure.

7. The semiconductor device of claim 1, further comprising:
    a cell stack structure disposed at the same height as the dummy buffer stack structure on the first structure, the cell stack structure including interlayer insulating layers and conductive patterns, which are alternately stacked, and cell pillars penetrating the interlayer insulating layers and the conductive patterns; and
    a source stack structure disposed between the first structure and the cell stack structure, the cell pillar penetrating a portion of the source stack structure.

8. The semiconductor device of claim 7, wherein the source stack structure includes:
    a first source conductive layer; and
    a second source conductive layer disposed on the first source conductive layer and penetrated by the cell pillar, the second source conductive layer contacting a channel layer of the cell pillar.

9. The semiconductor device of claim 8, wherein the cell pillar includes:
    the channel layer penetrating the interlayer insulating layers, the conductive patterns and the second source conductive layer, the channel layer extending inside the first source conductive layer;
a first memory pattern disposed between the channel layer and the interlayer insulating layers and conductive patterns; and
a second memory pattern isolated from the first memory pattern by the second source conductive layer, the second memory pattern being disposed between the channel layer and the first source conductive layer.

10. The semiconductor device of claim 7, wherein the peripheral contact hole has a wider diameter than the cell pillar.

11. A semiconductor device comprising:
a first structure including a substrate and a peripheral circuit disposed on the substrate;
a second structure disposed on the first structure, the second structure including a source stack structure and a dummy source stack structure, which are disposed at the same height, wherein the number of layers consisting of the dummy source stack structure is larger than that of the source stack structure;
a third structure disposed on the second structure, the third structure including a cell stack structure and a dummy buffer stack structure, which are isolated from each other; and
a peripheral contact plug penetrating the dummy buffer stack structure and the dummy source stack structure, the peripheral contact plug being electrically connected to the peripheral circuit.

12. The semiconductor device of claim 11, wherein the peripheral circuit includes a resistor connected to the peripheral contact plug.

13. The semiconductor device of claim 11, wherein the peripheral circuit includes a driver transistor electrically connected to the peripheral contact plug via a connecting structure.

14. The semiconductor device of claim 11, wherein the source stack structure includes:
a first source conductive layer; and
a second source conductive layer disposed on the first source conductive layer.

15. The semiconductor device of claim 14, wherein the cell stack structure includes:
interlayer insulating layers and conductive patterns, which are alternately stacked on the second source conductive layer; and
a channel layer extending inside the first source conductive layer by penetrating the interlayer insulating layers, the conductive patterns, and the second source conductive layer.

16. The semiconductor device of claim 15, further comprising:
a first memory pattern disposed between the channel layer, the interlayer insulating layers, and conductive patterns while surrounding the channel layer; and
a second memory pattern isolated from the first memory pattern by the second source conductive layer, the second memory pattern being disposed between the first source conductive layer and the channel layer while surrounding the channel layer.

17. The semiconductor device of claim 11, wherein the dummy source stack structure includes:
a first source conductive layer;
a protective layer formed on the first source conductive layer; and
a source sacrificial layer formed on the protective layer.

18. The semiconductor device of claim 11, wherein the dummy buffer stack structure includes:
dummy interlayer insulating layers and dummy sacrificial insulating layers, which are alternately stacked on the dummy source stack structure; and
first dummy conductive rings stacked in a line inside the respective dummy sacrificial insulating layers, the first dummy conductive rings surrounding the peripheral contact plug.

19. The semiconductor device of claim 18, further comprising:
an etch stop pattern disposed between the dummy source stack structure and the dummy buffer stack structure; and
a second dummy conductive ring disposed at the same level as the etch stop pattern, the second dummy conductive ring overlapping, at least in part, the first dummy conductive rings.

20. The semiconductor device of claim 11, further comprising:
a source penetrating insulating layer penetrating the dummy source stack structure, the peripheral contact plug penetrating the source penetrating insulating layer;
a slit insulating layer disposed on the third structure to cover the third structure, the slit insulating layer extending to penetrate the cell stack structure and the dummy buffer stack structure, the peripheral contact plug penetrating the slit insulating layer; and
an insulating spacers disposed between a sidewall of the cell stack structure and the slit insulating layer and between a sidewall of the dummy buffer stack structure and the peripheral contact plug.

* * * * *